United States Patent
Makino

(10) Patent No.: US 6,787,004 B2
(45) Date of Patent: Sep. 7, 2004

(54) METHOD FOR MANUFACTURING A SPIN VALVE FILM AND A METHOD OF MANUFACTURING A MAGNETORESISTANCE-EFFECT TYPE MAGNETIC HEAD

(75) Inventor: Eiji Makino, Kanagawa (JP)

(73) Assignee: Sony Corporation, Tokyo (JP)

( * ) Notice: Subject to any disclaimer, the term of this patent is extended or adjusted under 35 U.S.C. 154(b) by 26 days.

(21) Appl. No.: 10/204,797

(22) PCT Filed: Nov. 28, 2001

(86) PCT No.: PCT/JP01/10403
§ 371 (c)(1),
(2), (4) Date: Nov. 25, 2002

(87) PCT Pub. No.: WO02/052658
PCT Pub. Date: Jul. 4, 2002

(65) Prior Publication Data
US 2003/0146086 A1 Aug. 7, 2003

(51) Int. Cl.[7] .............................................. C23C 14/34
(52) U.S. Cl. .............................. 204/192.15; 204/192.12
(58) Field of Search ....................... 204/192.12, 192.15, 204/192.2; 427/331, 350

(56) References Cited

U.S. PATENT DOCUMENTS

2003/0193759 A1 * 10/2003 Hayashi ................... 360/324.1

FOREIGN PATENT DOCUMENTS

| JP | 11-144956 | 5/1999 | ........... H01F/10/16 |
| JP | 2000-058941 | 2/2000 | ........... H01L/43/12 |
| JP | 2001-052314 | 2/2001 | ............ G11B/5/39 |
| JP | 2001-283413 | 10/2001 | ............ G11B/5/39 |

OTHER PUBLICATIONS

English translation of JP 2001–283413 A.*

* cited by examiner

Primary Examiner—Steven Versteeg
(74) Attorney, Agent, or Firm—Sonnenschein, Nath & Rosenthal LLP

(57) ABSTRACT

A Cu film as the non-magnetic layer of a spin valve film is formed on a substrate in a sputter film forming chamber in which a film is formed by sputtering under a reduced pressure, a substrate is exposed to a gas atmosphere in a gas exposing chamber into which gas activating the surface of the Cu film is introduced, and the substrate is moved again to the sputter film forming chamber to form the remaining portion of the spin valve film.

14 Claims, 23 Drawing Sheets

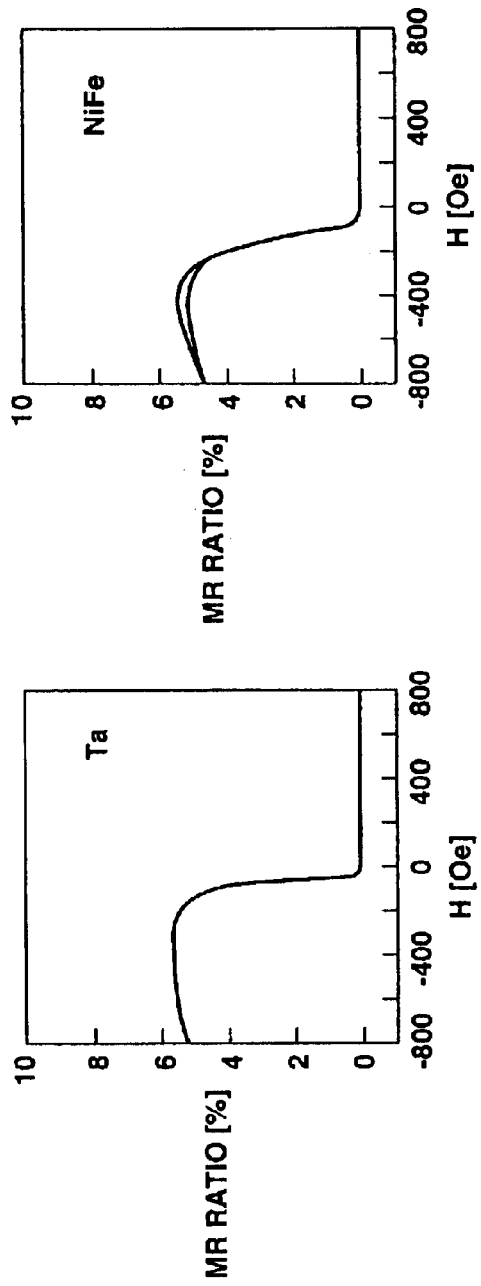
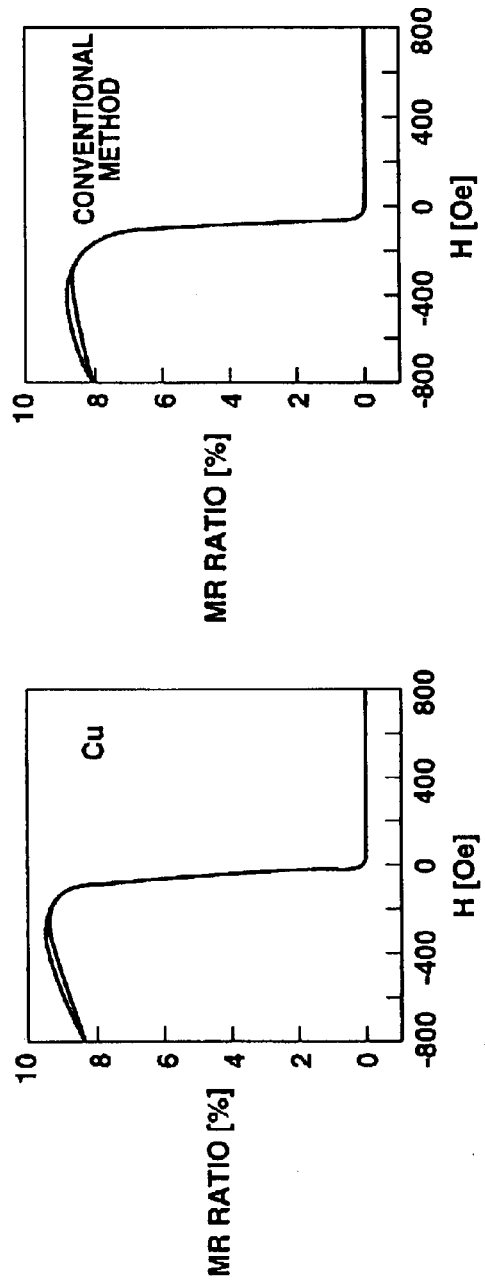
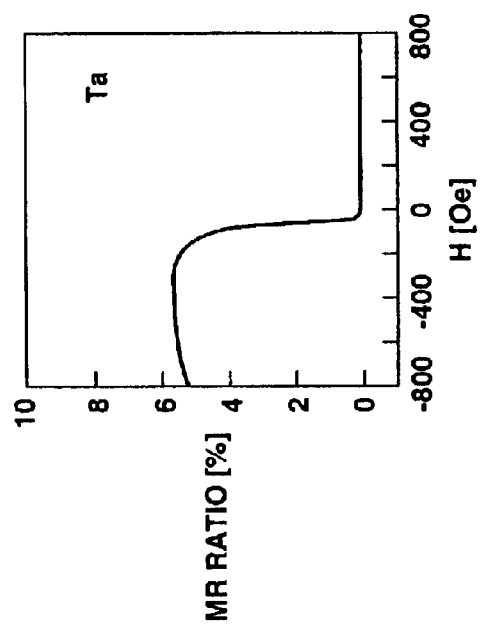
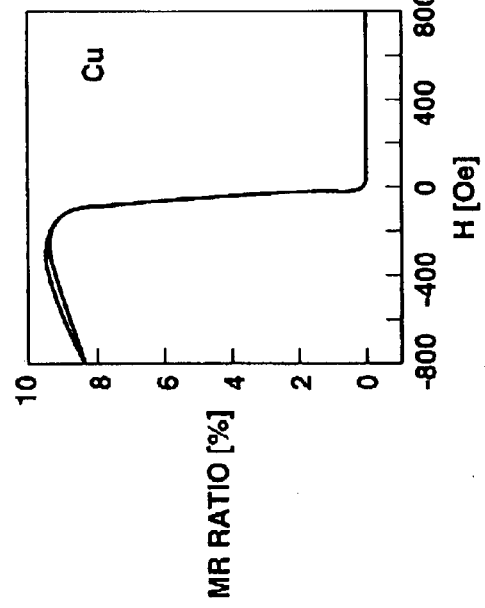
FIG.23A
FIG.23B
FIG.23C
FIG.23D

METHOD FOR MANUFACTURING A SPIN VALVE FILM AND A METHOD OF MANUFACTURING A MAGNETORESISTANCE-EFFECT TYPE MAGNETIC HEAD

TECHNICAL FIELD

The present invention relates to a method of manufacturing a spin valve film that is one type of a magnetoresistance effect element. The invention also relates to a method of manufacturing a magnetoresistance-effect magnetic lead that incorporates such a spin valve film as a magnetism-sensitive element for detecting magnetic signals emanating from magnetic recording media.

BACKGROUND OF THE INVENTION

Magnetoresistance effect elements (hereinafter referred to as MR elements) make use of so-called "magnetoresistance effect," i.e., a change in resistance, which results from a change in the intensity and direction of an external magnetic field. For example, MR elements are used for magnetic heads as magnetism-sensitive elements for detecting a signal magnetic field from magnetic recording medium. Magnetic heads comprising an MR element are generally known as "magnetoresistance-effect magnetic heads" (hereinafter referred to as MR heads).

MR elements utilizing anisotropic magnetoresistance effect have hitherto been used. They have but a small rate of change in magnetoresistance (MR ratio). It is therefore desired that MR elements having a large MR ratio be provided.

Giant MR elements (hereinafter referred to as "GMR elements"), each using a spin valve film, are proposed as MR element having a large MR ratio.

A GMR element has a spin valve film that comprises a pair of magnetic layers and a nonmagnetic layer interposed between the magnetic layers. It makes use of so-called "giant magnetoresistance effect, i.e., a change in the conductance of a so-called "sense current" that flows in a surface of the spin valve film, which depends upon the relative angle between the axes of magnetization of the magnetic layers.

More specifically, a spin valve film comprises an anti-ferromagnetic layer, a magnetization-fixed layer, a magnetization-free layer, and a nonmagnetic layer, which are laid one upon another. The magnetization-fixed layer has been magnetized in a prescribed direction when an exchange-coupling magnetic field acting between it and the anti-ferromagnetic layer. The magnetization-free layer has its magnetization direction changed in accordance with the external magnetic field. The nonmagnetic layer magnetically isolate the magnetization-fixed layer and the magnetization-free layer from each other.

When an external magnetic field is applied to the GMR element, the magnetization direction of the magnetization-fee layer changes in accordance with the intensity and direction of the external magnetic field. When the magnetization direction of the magnetization-free layer becomes anti-parallel to the magnetization direction of the magnetization-fixed layer, the sense current flowing in the spin valve film reaches the maximal value. When the magnetization direction of the magnetization-free layer becomes parallel to the magnetization direction of the magnetization-fixed layer, the sense current flowing in the spin valve film reaches the minimal value.

When a sense current of a prescribed value is supplied to a magnetic head comprising such a GMR element (hereinafter referred to as "GMR head"), the sense current flowing in the GMR element changes in terms of voltage in accordance with the signal magnetic field from the magnetic recording medium. The change in the voltage of the sense current is detected, whereby a magnetic signal can be read from a magnetic recording medium.

The GMR head needs to have its MR ratio increased, in order to record data at higher densities on magnetic recording media. To this end, the Cu film that is the nonmagnetic layer of the spin valve film may be made thinner.

If the Cu film, i.e., the nonmagnetic layer, is made thinner, however, the inter-layer coupling between the magnetization-fixed layer and the magnetization-free layer will increase. This makes it difficult to set a bias point in the course before the head operates.

It is required that the Cu film be about 26 Å or more thick so that the inter-layer coupling may become, for example, 20 Oe or less. The Cu film cannot help but have high conductivity and allows the passage of a large current. This gives rise to a large split loss. Consequently, the MR ratio of the spin valve film decreases very much.

Recent studies show that, when a Cu film to be processed into a nonmagnetic layer is formed by means of sputtering at a reduced pressure in the chamber of a sputtering apparatus, the surface smoothness of the Cu film was enhanced by virtue of the pressures and compositions of the residual gas, such as oxygen, hydrogen or the like. On the other hand, the static magnetic coupling between the magnetization-fixed layer and the magnetization-free layer, which depends upon the surface roughness of the Cu film, decreases to reduce the inter-layer coupling. That is, the inter-layer coupling between the magnetization-fixed layer and the magnetization-free layer can be lowered by decreasing the degree of vacuum in the chamber, rather than by raising the degree of vacuum.

However, the method of decrease the inter-layer coupling between the magnetization-fixed layer and the magnetization-free layer by using the residual gas in the chamber can hardly be practiced because it is difficult to maintain the residual gas in the same state. The method can hardly improve the productivity.

The residual gas in the chamber may be maintained in the same state in terms of composition, back-pressure and the like. Even in this case, if the degree of vacuum is degraded, the anti-ferromagnetic layer of the spin valve film is degraded in characteristics. If the anti-ferromagnetic layer is made of PtMn, PdPtMn or the like, which is most commonly used Mn-based anti-ferromagnetic material, it can acquire good characteristics and can be thin by raising the degree of vacuum in the chamber.

Therefore, spin valve films are usually formed at a high vacuum in the chamber so that the anti-ferromagnetic film is to acquire good characteristics. It is extremely difficult, however, to make the Cu film (i.e., the nonmagnetic layer) as thin as desired, without increasing the inter-layer coupling between the magnetization-fixed layer and the magnetization-free layer.

SUMMARY OF THE INVENTION

The present invention has been made in view of the foregoing. An object of the invention is to provide a method of manufacturing a spin valve film, in which the inter-layer coupling between the magnetization-fixed layer and the magnetization-free layer can be suppressed even if the Cu film, i.e., the anti-ferromagnetic layer, is thin, and the anti-ferromagnetic layer can be formed at a higher vacuum than before. Another object of this invention is to provide a method of manufacturing a magnetoresistance magnetic head incorporating such a spin valve film as a magnetism-sensitive element for detecting magnetic signals emanating from magnetic recording media.

To achieve the first object, a method is provided, which is designed to manufacture a spin valve film comprising an anti-ferromagnetic layer, a magnetization-fixed layer magnetized in a prescribed direction by an exchange coupling magnetic field acting between it and the anti-ferromagnetic layer, a magnetization-free layer having a magnetization direction in accordance with an external magnetic field, and a nonmagnetic layer made of a Cu film magnetically isolating the magnetization-fixed layer and the magnetization-free layer, which are laid one upon another on at least a substrate. The method comprises: forming some layers, the last of which is the Cu film serving as the nonmagnetic layer, on the substrate by means of sputtering performed at a reduced pressure in a film-forming sputtering chamber; exposing gas-exposure chamber; and forming the remaining layers of the spin valve film, on the substrate, in the film-forming sputtering chamber.

The method uses two chambers, i.e., the film-forming sputtering chamber and the gas-exposure chamber. Thus, an extremely high vacuum can be maintained in the film-forming sputtering chamber, and the surfactant gas introduced into the gas-exposure chamber can retain a high repeatability.

In the film-forming sputtering chamber, some layers, the last of which is the Cu film serving as the nonmagnetic layer, are formed on the substrate. In the gas-exposure chamber, the substrate is exposed in an atmosphere of gas that activates a surface of the Cu film, thereby smoothing the surface of the Cu film. Additionally, the anti-ferromagnetic layer can be formed on the substrate in a higher vacuum than before.

The inter-layer coupling acting between the magnetization-fixed layer and the magnetization-free layer can therefore be suppressed even if the Cu film interposed between said layers and serving as a nonmagnetic layer is made thin. Further, the anti-ferromagnetic layer can acquire good characteristics. Hence, it is easy to manufacture a high-quality spin valve film that exhibits an improved rate of change in magnetoresistance.

To achieve the other object, a method is provided, which is designed to manufacture a magnetoresistance-effect magnetic head comprising a spin valve film as a magnetism-sensitive element for detecting magnetic signals emanating from magnetic recording media. The spin valve film comprises an anti-ferromagnetic layer, a magnetization-fixed layer magnetized in a prescribed direction by an exchange coupling magnetic field acting between it and the anti-ferromagnetic layer, a magnetization-free layer having a magnetization direction in accordance with an external magnetic field, and a nonmagnetic layer made of a Cu film magnetically isolating the magnetization-fixed layer and the magnetization-free layer, which are laid one upon another on at least a substrate. The method comprises forming the spin valve film by: forming some layers, the last of which is the Cu film serving as the nonmagnetic layer, on the substrate by means of sputtering performed at a reduced pressure in a film-forming sputtering chamber; exposing the substrate in a gas atmosphere in a gas-exposure chamber filled with gas that activates a surface of the Cu film; and forming the remaining layers of the spin valve film, on the substrate, in the film-forming sputtering chamber.

In the method of manufacturing a magnetoresistance-effect magnetic head according to the invention, two chambers are used, i.e., the film-forming sputtering chamber and the gas-exposure chamber, in forming the spin valve film. Thus, an extremely high vacuum can be maintained in the film-forming sputtering chamber, and the surfactant gas introduced into the gas-exposure chamber can retain a high repeatability.

In the film-forming sputtering chamber, some layers, the last of which is the Cu film serving as the nonmagnetic layer, are formed on the substrate. In the gas-exposure chamber, the substrate is exposed in an atmosphere of gas that activates a surface of the Cu film, thereby smoothing the surface of the Cu film. Additionally, the anti-ferromagnetic layer can be formed on the substrate in a higher vacuum than before.

The inter-layer coupling acting between the magnetization-fixed layer and the magnetization-free layer can therefore be suppressed even if the Cu film interposed between said layers and serving as a nonmagnetic layer is made thin. Moreover, the anti-ferromagnetic layer can acquire good characteristics. As a result, it is easy to manufacture a high-quality magnetoresistance-effect magnetic head that exhibits an improved rate of change in magnetoresistance of a spin valve film.

Other objects of the invention and the specific advantages of the invention will be more apparent from the following description of embodiments.

BRIEF DESCRIPTION OF THE DRAWINGS

FIGS. 23A, 23B, 23C and 23D are graphs, each showing the relationship between the external magnetic field H and the MR ratio of Sample 6 of a spin valve film. FIG. 23A shows the relation observed after a Ta film was formed, FIG. 23B the relation observed after an NiFe film was formed; FIG. 23C the relation observed after a Cu film was formed, when the substrate was exposed in a surfactant gas atmosphere, and FIG. 23D the relation observed when the substrate was not exposed in a surfactant gas atmosphere;

DETAILED DESCRIPTION OF THE PRESENTLY PREFERRED EMBODIMENTS

A method of manufacturing a spin valve film and a method of manufacturing a magnetoresistance-effect magnetic head, both according to the present invention, will be described in detail with reference to the accompanying drawings.

The method of manufacturing a spin valve film, according to the invention, will be described first.

Figure 1:
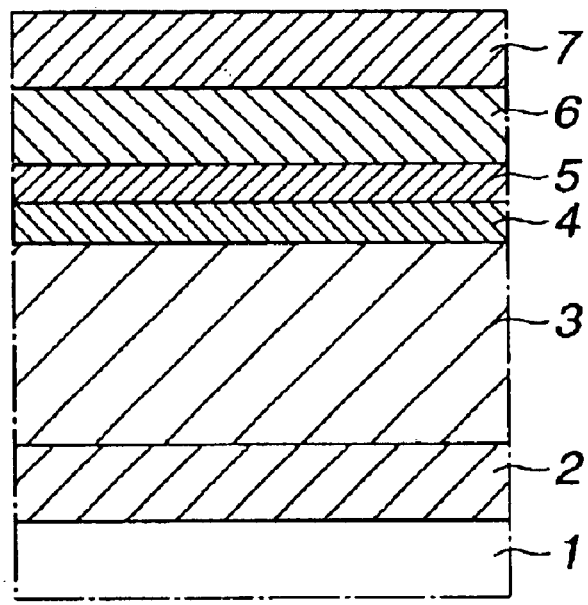
FIG. 1 is a sectional view of a BSV-type and a BSSV-type spin valve film.

As shown in, for example, FIG. 1, the spin valve film made by this method may be of either a so-called "bottom-type spin valve (BSV) type" or a so-called "bottom-type synthetic spin valve (BSSV) type." The spin valve film is formed on a substrate 1. It is a multi-layer structure that comprises an under layer 2, an anti-ferromagnetic layer 3, a magnetization-fixed layer 4, a nonmagnetic layer 5, a magnetization-free layer 6, and a protective layer 7. The layers 3, 4, 5, 6 and 7 are laid one upon another on the substrate in the order they are mentioned.

The substrate 1 is made of hard, nonmagnetic, electrically nonconductive material such as $Al_2O_3$, $Al_2O_3$—TiC (Altic), diamond-like carbon (DLC), or the like.

The under layer 2 and the protective layer 7 are provided to prevent the specific resistance of the spin valve film from increasing. They are made of, for example, Ta or the like.

The anti-ferromagnetic layer 3 is made of anti-ferromagnetic material such as Pt—Mn alloy, Pd—Pt—Mn alloy, Ir—Mn alloy, Rh—Mn alloy, Ni—Mn alloy, Co—Mn alloy, Fe—Mn alloy, Cr—Mn—Pt alloy or the like.

The magnetization-fixed layer 4 is made of magnetic material that exhibits good soft magnetic property, such as Ni—Fe alloy, Co—Fe alloy, Co—Ni—Fe alloy or the like. The magnetization-fixed layer 4 may be a multi-layer structure comprising layers of these alloys. Alternatively, the layer 4 may be a so-called "laminated ferri structure" that comprises layers of these alloys and nonmagnetic layers of, for example, Ru or the like, which are alternately laid one upon another. The magnetization-fixed layer 4, which is arranged adjacent to the anti-ferromagnetic layer 3, is magnetized in a fixed direction by virtue of an exchange-coupling magnetic field that acts between it and the anti-ferromagnetic layer 3.

The nonmagnetic layer 5 is made of Cu, a nonmagnetic material that has high electric conductivity.

The magnetization-free layer 6 is made of magnetic material that exhibits good soft magnetic property, such as Ni—Fe alloy, Co—Fe alloy, Co—Ni—Fe alloy or the like. Additionally, the layer 6 may be a multi-layer structure comprising layers of these alloys. The layer 6 is magnetically isolated from the magnetization-fixed layer 4, with the nonmagnetic layer 5. Hence, the direction of magnetization can be easily changed in the layer 6 with respect to a weak external magnetic field.

Figure 2:
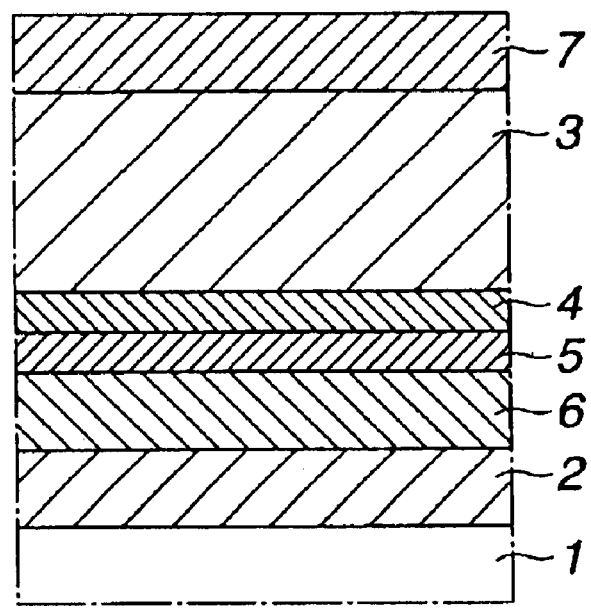
FIG. 2 is a sectional view of a TSV-type and a TSSV-type spin valve film.

The spin valve film is not limited to the structure described above. Rather, it may be, for example, a so-called "top-type spin valve film (TSV)" or a so-called "top-type, synthetic spin valve film (TSSV)." As FIG. 2 shows, the spin valve film of either type is a multi-layer structure formed on a substrate 1. It comprises an under layer 2, a magnetization-free layer 6, a nonmagnetic layer 5, a magnetization-fixed layer 4, an anti-ferromagnetic layer 3, and a protective layer 7. The layers 2, 6, 5, 4, 3 and 7 are laid one upon another on the substrate in the order they are mentioned.

Figure 3:
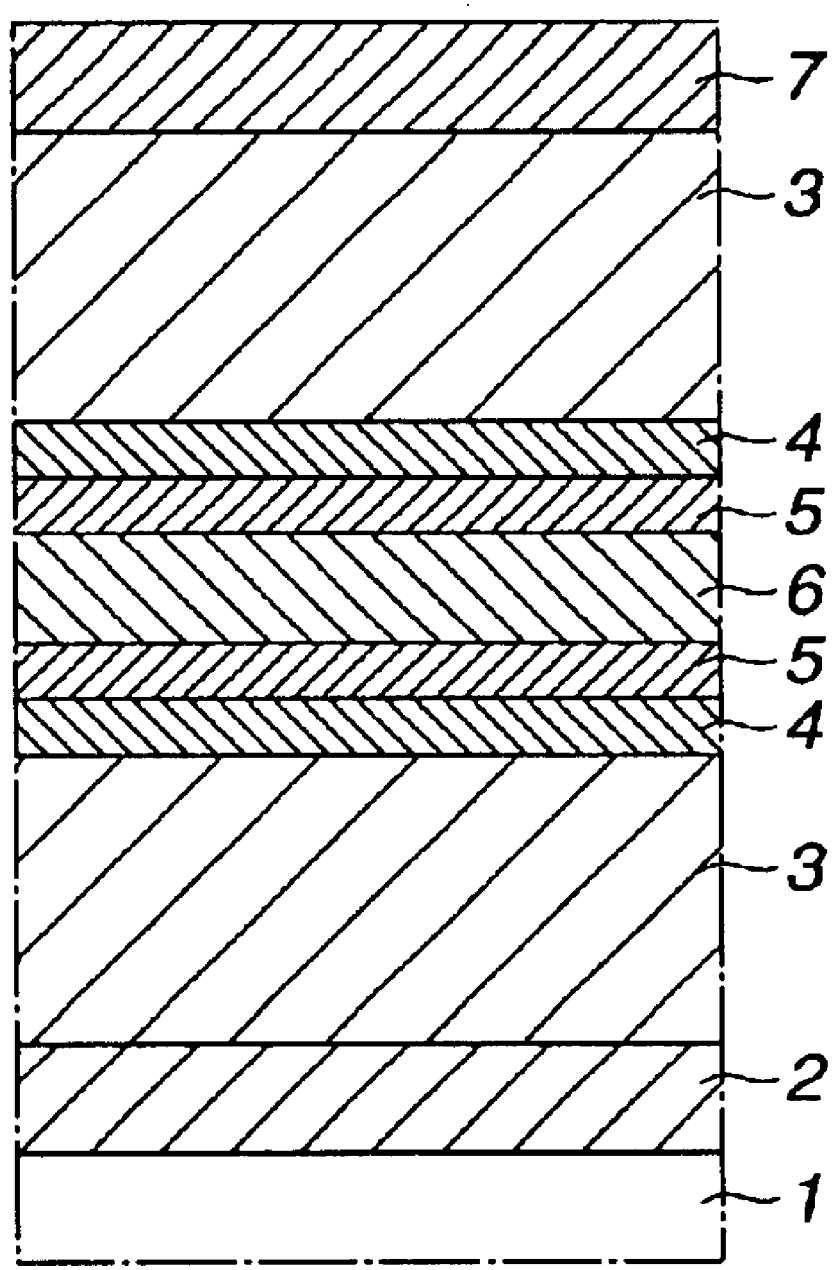
FIG. 3 is a sectional view of a DSV-type and a DSSV-type spin valve film.

Alternatively, the spin valve film may be a so-called "dual spin valve film (DSV)" or a so-called "dual synthetic spin valve film (DSSV)." As FIG. 3 shows, the spin valve film of either type is a multi-layer structure formed on a substrate 1. It comprises an under layer 2, an anti-ferromagnetic layer 3, a magnetization-fixed layer 4, a nonmagnetic layer 5, a magnetization-free layer 6, another nonmagnetic layer 5, another magnetization-fixed layer 4, another anti-ferromagnetic layer 3, and a protective layer 7. These layers are laid one upon another on the substrate in the order they are mentioned.

When an external magnetic field is applied to the spin valve film thus constructed, the direction of magnetization changes in the magnetization-free layer 6 in accordance with the intensity and direction of the external magnetic field. When the direction of magnetization is antiparallel to the direction of magnetization in the magnetization-free layer 6, the resistance to the current flowing in the spin valve film is maximal. Conversely, the resistance to the current flowing in the spin valve film is minimal when the direction of magnetization is parallel to the direction of magnetization in the magnetization-free layer 6.

Thus, the electrical resistance of the spin valve film changes in accordance with the external magnetic field applied to the film. It is therefore possible to detect the external magnetic field by reading the change in the electrical resistance.

Figure 4:
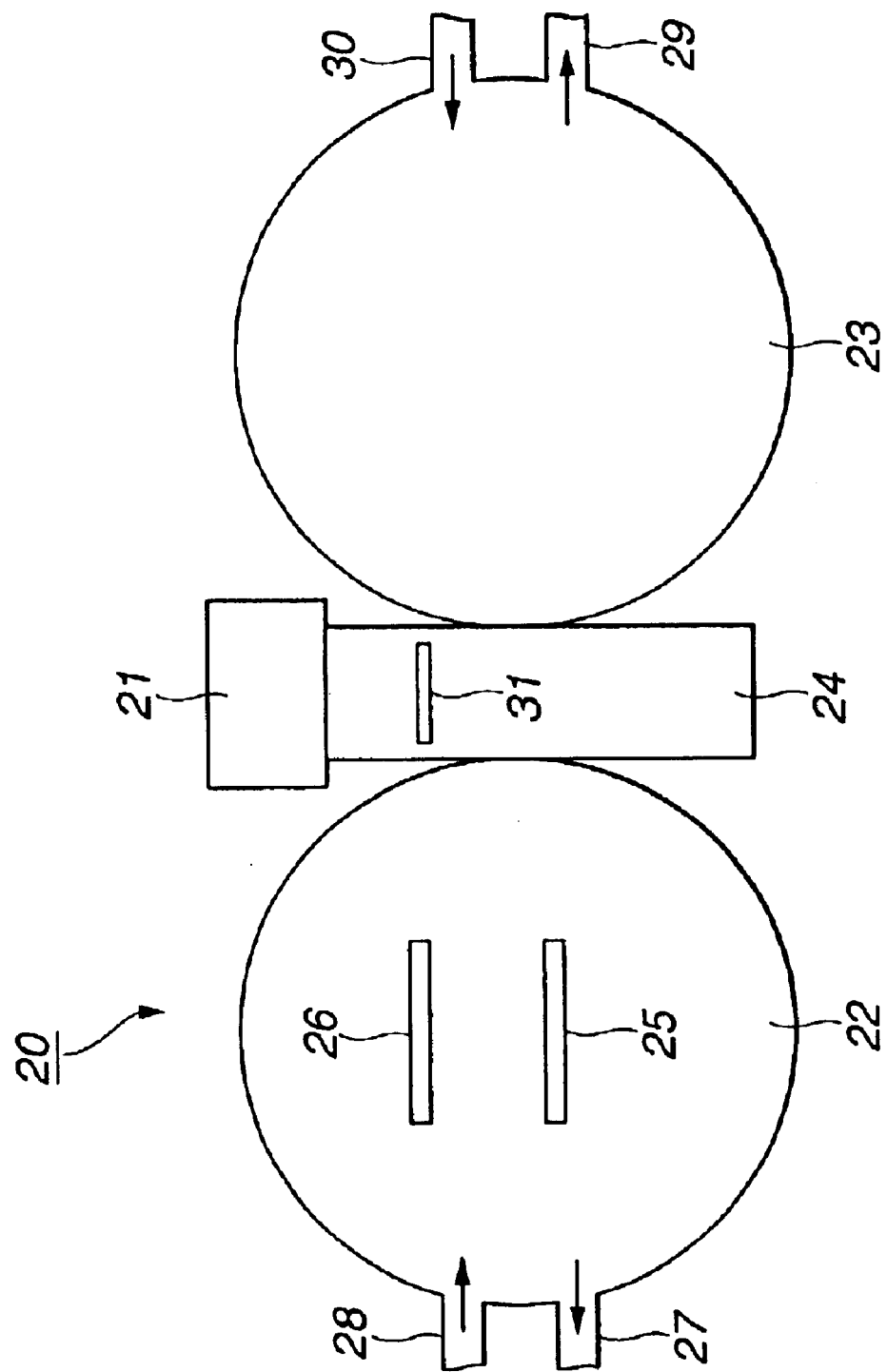
FIG. 4 is a schematic representation of a sputtering apparatus.

In the method according to the present invention, the spin valve film is formed by using such a sputtering apparatus 20 as is illustrated in FIG. 4. Note that FIG. 4 is a schematic representation of the sputtering apparatus 20.

The sputtering apparatus 20 is a type known as "DC magnetron sputtering apparatus." The apparatus 20 comprises four chambers. The four chambers are a substrate-storing chamber 21, a film-forming sputtering chamber 22, a gas-exposure chamber 23, and a substrate-transferring chamber 24.

The substrate-storing chamber 21 is located adjacent to the substrate-transferring chamber 24. Substrates are transported into and from the substrate-storing chamber 21. The substrate-storing chamber 21 can be depressurized by means of a vacuum pump (not shown). It can be depressurized to a vacuum degree of about $5 \times 10^{-7}$ Torr.

The film-forming sputtering chamber 22 is designed to perform sputtering to form films in a high vacuum. The chamber 22 is arranged adjacent to the substrate-transferring chamber 24.

The film-forming sputtering chamber 22 incorporates a pair of electrodes, i.e., a cathode 25 and an anode 26 that oppose each other. A target made of material for one layer of the above-mentioned spin valve film is mounted on the cathode 25. A substrate 1, on which the spin valve film will be formed, is mounted on the anode 26.

The film-forming sputtering chamber 22 has a gas outlet port 27 and a gas inlet port 28. The chamber 22 can be depressurized through the gas outlet port 27 by means of a vacuum pump (not shown) to a vacuum degree of approximately $5 \times 10^{-9}$ Torr. Ar gas can be introduced into the chamber 22 through the gas inlet port 28, while adjusting the degree of vacuum in the film-forming sputtering chamber 22. The flow rate of the gas is controlled by changing the mass flow. Inert gases other than Ar gas, such as Ne gas, Kr gas or Xe gas, can be introduced into the film-forming sputtering chamber 22.

In the film-forming sputtering chamber 22, a negative potential is applied to the target on the cathode 25 and a positive potential is applied to the substrate 1 on the anode 26, in an Ar gas atmosphere in order to form a spin valve film on the substrate 1. A potential difference develops between the cathode 25 and the anode 26, i.e., a pair of electrodes. The potential difference induces glow discharge. The glow discharge ionizes the Ar particles, which bombard the target. Bombarded with the ionized Ar particles, the target emits particles. These particles deposit on the substrate 1, forming one layer of the spin valve film. In the film-forming sputtering chamber 22, so-called "reverse sputtering" can be performed to etch the substrate 1.

The gas-exposure chamber 23 is a chamber in which the substrate 1 can be exposed in a gas atmosphere. The chamber 23 is located adjacent to the substrate-transferring chamber 24.

The gas-exposure chamber 23 has a gas outlet port 29 and a gas inlet port 30. The chamber 23 can be depressurized through the gas outlet port 29 by means of a vacuum pump (not shown) to a vacuum degree of approximately $1 \times 10^{-8}$ Torr. Gas, which may activate the surface of a Cu film, can be introduced into the chamber 23 through the gas inlet port 30, while adjusting the degree of vacuum in the gas-exposure chamber 23. The amount in which the gas is introduced is controlled by changing the mass flow.

The gas for activating the surface of the Cu film is, for example, oxygen, hydrogen, nitrogen or the like. The gas may be a mixture gas that contains at least one of these gases exemplified. (Hereinafter, the gas for activating the surface of the Cu film will be referred to as "surfactant gas.")

Through the gas inlet port, inert gases such as Ar gas, Ne gas, Kr gas or Xe gas, can be introduced into the gas-exposure chamber 23.

Assume that a high vacuum is generated in the gas-exposure chamber 23. Then, the overshoot of the surfactant gas introduced via the gas inlet port 30 becomes relatively large at the time of adjusting the amount in which the gas is introduced, by controlling the mass flow.

In view of this it is desired that an inert gas be introduced into the gas-exposure chamber 23 before the surfactant gas is supplied into the chamber 23. This measure taken, the degree of vacuum in the chamber 23 can be lowered to an appropriate value.

The overshoot of the surfactant gas can thereby be reduced when the surfactant gas is introduced into the gas-exposure chamber 23 through the gas inlet port 30. This makes it possible to adjust the amount in which the gas is introduced, by controlling the mass flow. In the embodiment, the insert gas used is Ar gas.

The substrate-transferring chamber 24 is provided to transport substrates 1 between the substrate-storing chamber 21, the film-forming sputtering chamber 22 and the gas-exposure chamber 23. The chamber 24 incorporates a robot 31 that can transport substrates 1 to each chamber. The substrate-transferring chamber 24 can be depressurized by means of a vacuum pump (not shown) to a vacuum degree of approximately $1 \times 10^{-8}$ Torr.

A method of manufacturing the spin valve film by using the sputtering apparatus 20 described above will be described. Assume that the spin valve film is a BSSV type formed on a substrate 1 and comprising a 3-nm thick Ta film, or an under layer 2; a 20-nm thick PtMn film, or an anti-ferromagnetic layer 3; a 1.5-nm thick CoFe film, a 0.8-nm thick Ru film and a 2.0-nm thick CoFe film, forming a magnetization-fixed layer 4; a 2.2-nm thick Cu film, or a nonmagnetic layer 5; a 0.5-nm thick CoFe film and a 4-nm thick NiFe film, forming a magnetization-free layer 6; and a 3-nm thick Ta film, or a protective layer 7. These films have been laid one upon another in the order they are mentioned.

To form this spin valve film, the substrate 1 is set in the substrate-storing chamber 21.

Then, the robot 31 moves in the substrate-transferring chamber 24 and transports the substrate 1 from the substrate-storing chamber 21 into the film-forming sputtering chamber 22. In the film-forming sputtering chamber 22, the substrate 1 is placed on the anode 26. Six targets have been mounted on the cathode 25 provided in the film-forming sputtering chamber 22. They are a Ta target, a PtMn target, an NiFe target, a Ru target, a CoFe target and a Cu target.

In the film-forming sputtering chamber 22, press sputtering is carried out to prevent contamination with the targets specified above. Contamination with the substrate 1 is prevented, too, in the film-forming sputtering chamber 22. Further, reverse sputtering is performed to activate the surfaces of the substrate 1.

In the film-forming sputtering chamber 22, a Ta film (under layer 2), a PtMn film (anti-ferromagnetic layer 3), an NiFe film, an Ru film, a CoFe film and a Cu film (nonmagnetic layer 5), are formed by sputtering, one upon another in the order they are mentioned. Note that the NiFe film, Ru film, and CoFe film form the magnetization-fixed layer 4.

Next, the robot 31 moves in the substrate-transferring chamber 24 and transports the substrate 1 from the film-forming sputtering chamber 22 into the gas-exposure chamber 23. The substrate 1 is exposed in a gas atmosphere that contains a surfactant gas. The Cu film, or the nonmagnetic layer 5, has its surface rendered flat.

The surfactant gas may be introduced into the gas-exposure chamber 23, before or after the substrate 1 is transported into the gas-exposure chamber 23. In this method, the gas is introduced after the substrate 1 is brought into the gas-exposure chamber 23, and the surfactant gas used is oxygen.

Then, the robot 31 transports the substrate 1 from the gas-exposure chamber 23 into the substrate-transferring chamber 24. The robot 31 transports the substrate 1 back into the film-forming sputtering chamber 22, while moving in the substrate-transferring chamber 24. In the film-forming sputtering chamber 22, a CoFe film and a NiFe film, which form the magnetization-free layer 6, and a Ta film, or protective layer 7, are formed by sputtering, one upon another in the order mentioned, on the nonmagnetic layer 5, i.e., Cu film having a flat surface. The spin valve film is thereby formed on the substrate 1.

Next, the robot 31 moves in the substrate-transferring chamber 24, transporting the substrate 1 from the film-forming sputtering chamber 22 into the substrate-transferring chamber 24. The robot 31 then moves the substrate 1 from the chamber 22 into the substrate-storing storage chamber 21. The substrate 1 with the spin valve film formed on it is taken out of the substrate-storing chamber 21.

As specified above, two chambers, i.e., the film-forming sputtering chamber 22 and the gas-exposure chamber 23, are used in this method. This makes it possible not only to maintain an extremely high vacuum in the film-forming sputtering chamber 22, but also to achieve high repeatability of the surfactant gas introduced into the gas-exposure chamber 23.

After the Cu film, or nonmagnetic layer 5 of the spin valve film, is formed on the substrate 1 in the film-forming sputtering chamber 22, the substrate 1 is exposed in the atmosphere that contains the surfactant gas, in the gas-exposure chamber 23. The surface of the Cu film can be made flat, because the surfactant gas activates the surface of the Cu film. In the film-forming sputtering chamber 22, the anti-ferromagnetic layer 3 can be formed on the substrate 1 in a high vacuum.

Thus, the inter-layer coupling between the magnetization-fixed layer 4 and the magnetization-free layer 6 can be suppressed even if the Cu film (i.e., nonmagnetic layer 5) interposed between the layers 4 and 5 is relatively thin. Additionally, the anti-ferromagnetic layer can acquire good characteristics. Hence, with this method it is easy to manufacture a spin valve film that has a high MR ratio.

<Dependency on Gas Flow Rate>

Spin valve films were produced by the method according to the present invention, by introducing the surfactant gas into the gas-exposure chamber 23 at different flow rates. MR ratios ($\Delta$Rsq./Rsq.) were measured of the spin valve films thus produced. The inter-layer coupling Hin between the magnetization-fixed layer 4 and magnetization-free layer 6 of each spin valve film were measured, too, to determine the dependency of Hin on the gas flow rate.

For comparison, some spin valve films were produced without transporting substrates 1 into the gas-exposure chamber 23 as in the conventional method, and some others spin valve films were made without exposing the substrates 1 to a surfactant gas atmosphere, though the substrates 1 were brought into the gas-exposure chamber 23. These spin valve films were examined, too, for MR ratio, Hin and the dependency of Hin on the gas flow rate.

In this example, a BSSV-type spin valve film was made as Sample 1. Sample 1 comprised an under layer 2, i.e., 3-nm thick Ta film, an anti-ferromagnetic layer 3, i.e., a 20-nm thick PtMn film, a magnetization-fixed layer 4 composed of a 1.5-nm thick CoFe film, a 0.9-nm thick Ru film and a 2-nm thick CoFe film, a nonmagnetic layer 5, i.e., 2.2-nm thick Cu film, a magnetization-free layer 6 composed of a 0.5-nm thick CoFe film and a 4-nm thick NiFe film, and a protective layer 7, i.e., 3-nm thick Ta film. The layers 2, 3, 4, 5, 6 and 7 were formed on a Si—O substrate 1, laid one upon another in the order they are mentioned.

Heat treatment was carried out for four hours, while applying a magnetic field of 10 KOe in an atmosphere of 265° C. during the process of forming the anti-ferromagnetic layer 3. Oxygen was used as surfactant gas. Oxygen was introduced into the gas-exposure chamber 23, for 30 seconds at a flow rate that has been adjusted to a specific value.

Figure 5A:
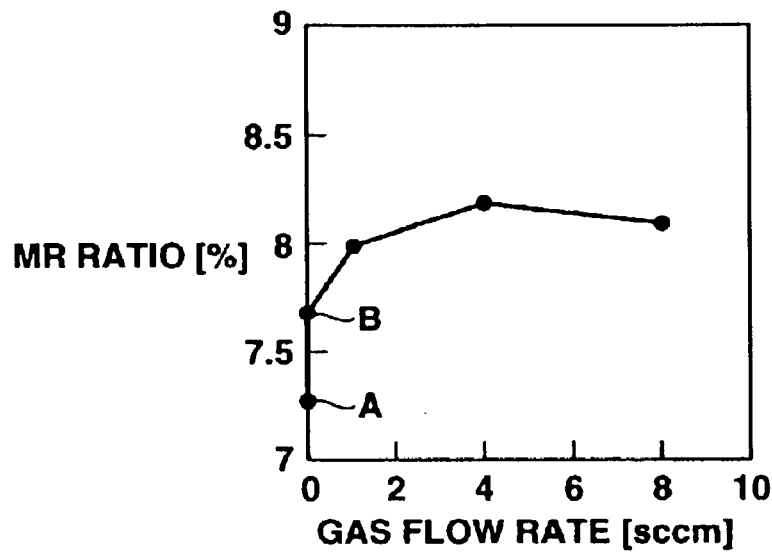
FIG. 5A is a graph showing the relation between the gas flow rate and the MR ratio of Sample 1 of a spin valve film.
Figure 5B:
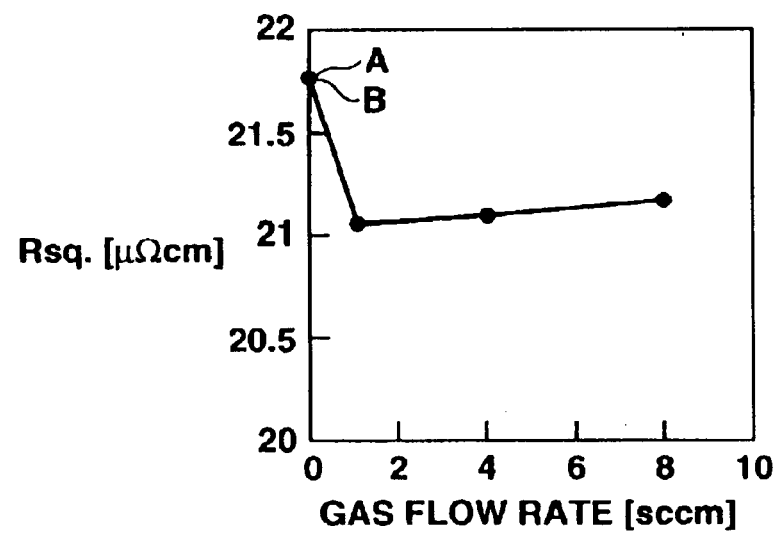
FIG. 5B is a graph illustrating the relation between the gas flow rate and the Rsq. of Sample 1.
Figure 5C:
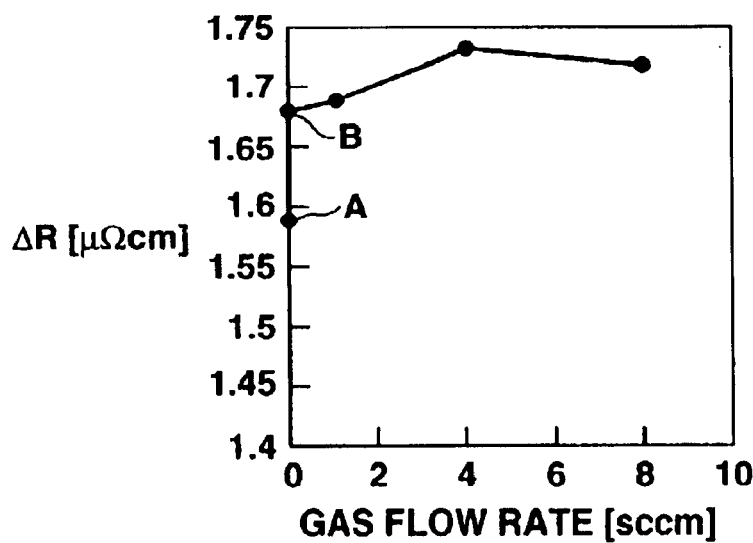
FIG. 5C is a graph representing the relation between the gas flow rate and ΔRsq. of Sample 1.
Figure 6:
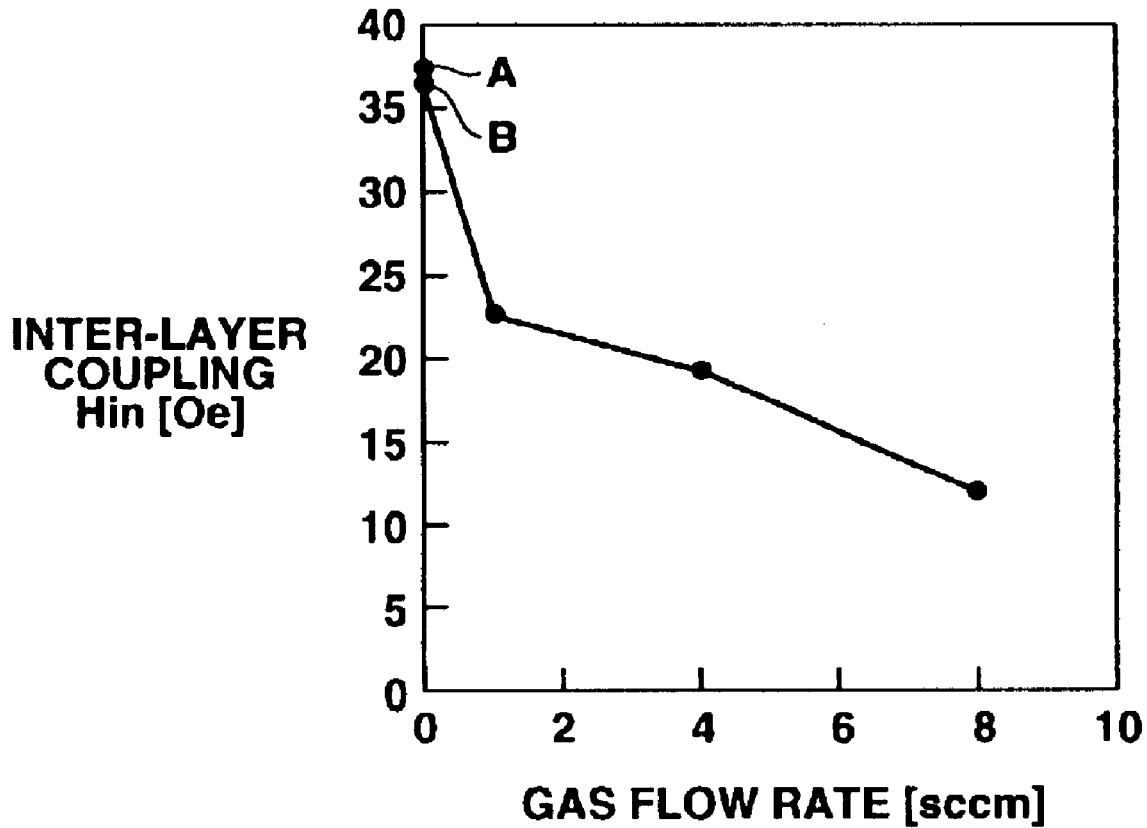
FIG. 6 is graph depicting the relation between the gas flow rate and the inter-layer coupling Hin of Sample 1 of a spin valve film.

Sample 1 thus made was examined. The results were as is shown in FIGS. 5A, 5B and 5C and FIG. 6. FIG. 5A is a graph showing the relation between the gas flow rate and the MR ratio. FIG. 5B is a graph illustrating the relation between the gas flow rate and the Rsq. FIG. 5C is a graph representing the relation between the gas flow rate and $\Delta$Rsq. FIG. 6 is a graph depicting the relation between the gas flow rate and the inter-layer coupling Hin.

In FIGS. 5A, 5B and 5C and FIG. 6, two points A and B are shown. Point A pertains to a spin valve film formed without transporting the substrate 1 into the gas-exposure chamber 23 as in the conventional method. Point B pertains to a spin valve film formed without exposing the substrate 1 to an atmosphere of the surfactant gas, though the substrate 1 was bought into the gas-exposure chamber 23.

As seen from the results shown in FIGS. 5A, 5B and 5C and FIG. 6, Rsq. greatly decreases if oxygen is introduced into the gas-exposure chamber 23, regardless of the flow rate of the gas. This is because oxygen used as surfactant gas improves the surface state of the Cu film, i.e., the nonmagnetic layer 5. More precisely, oxygen lessens the surface roughness of the Cu film, enhancing the elastic scattering to decrease Rsq. Since the MR ratio much increases in proportion to the Rsq., it is considered that the Cu film, i.e., nonmagnetic layer 5, has grown to have a clean interface. From this it is understood that ΔRsq. can increase in spite of the decrease of Rsq.

As the measurement results of FIG. 6 reveal, the inter-layer coupling Hin gradually decreases as oxygen is introduced into the gas-exposure chamber 23 and increases in amount in the chamber 23. Thus, the inter-layer coupling Hin between the magnetization-fixed layer 4 and the magnetization-free layer 6 can be decreased to a desirable value if the substrate 1 is exposed in an atmosphere of the surfactant gas after the Cu film, i.e., nonmagnetic layer 5, has been formed.

A spin valve film was formed without transporting the substrate 1 into the gas-exposure chamber 23 as in the conventional method. In this case, the MR ratio was about 7.3% (see point A shown in FIG. 5A). By contrast, the spin valve film formed without exposing the substrate 1 in the surfactant gas atmosphere, though transporting it into the gas-exposure chamber 23, exhibited an MR ratio of about 7.7% (see point B shown in FIG. 5B). This is probably because $H_2O$, $H_2$, $O_2$ and the like remaining in the chamber were adsorbed to the film since the vacuum in the gas-exposure chamber 23 and substrate-transferring chamber 24 is lower than in the film-forming sputtering chamber 22.

Figure 7A:
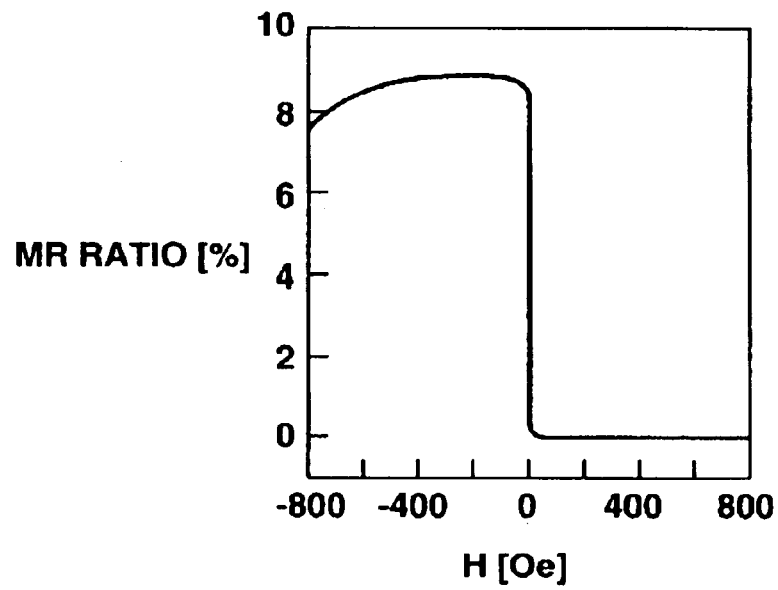
FIG. 7A is a graph illustrating the relation between the external magnetic field H and the MR ratio of Sample 1 of a spin valve film.
Figure 7B:
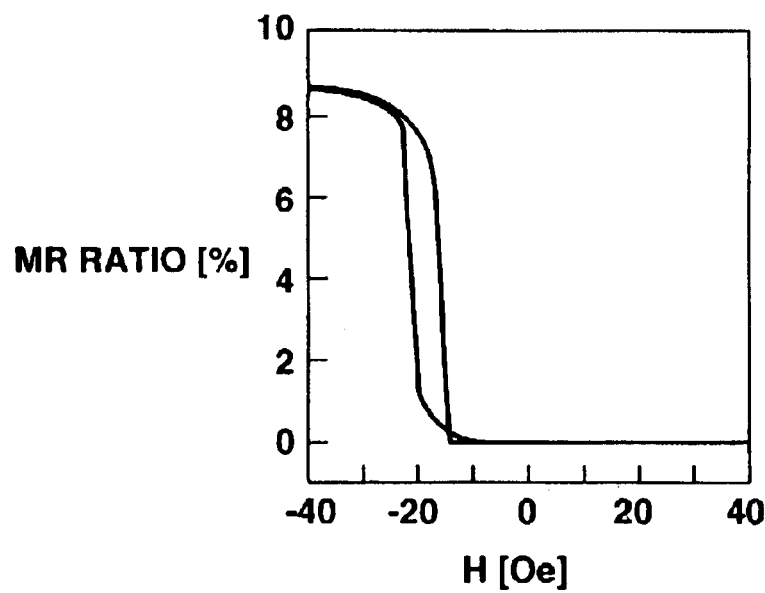
FIG. 7B is a magnified part of FIG. 7A, which shows a zero region of the external magnetic field.
Figure 8A:
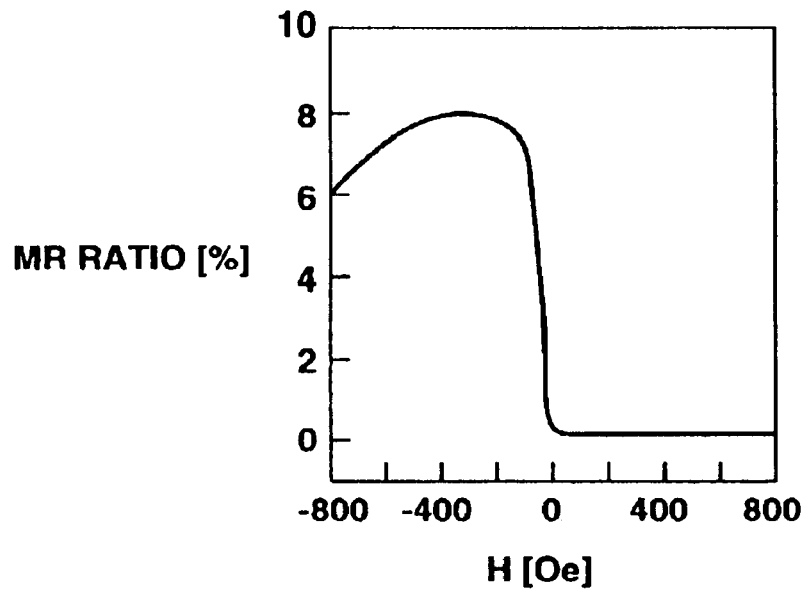
FIG. 8A is a graph representing the relation between the external magnetic field H and the MR ratio of a conventional spin valve film.
Figure 8B:
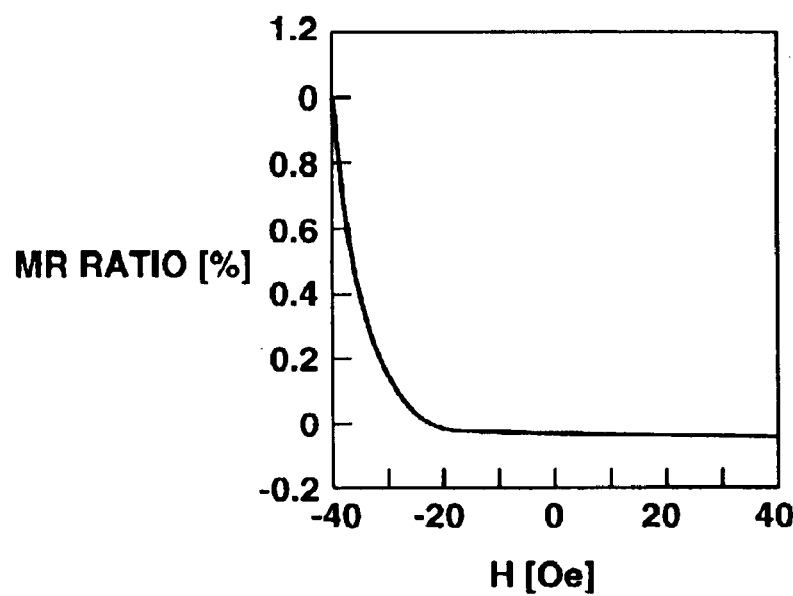
FIG. 8B is a magnified part of FIG. 8A, which shows a zero region of the external magnetic field.

FIGS. 7A and 7B show the relation between the external magnetic field H and the MR ratio, which was determined of Sample 1, i.e., a spin valve film of the present invention, formed by applying the gas at the maximum flow rate of 4 sccm. For the sake of comparison, FIGS. 8A and 8B show the relation between the external magnetic field H and the MR ratio of a spin valve film identical to Sample 1, except that it was formed without bringing the substrate 1 into the gas-exposure chamber 23 as in the conventional manufacturing method. FIG. 7B is a magnified part of FIG. 7A, which shows a zero region of the external magnetic field. Similarly, FIG. 8B is a magnified part of FIG. 8A, which shows a zero region of the external magnetic field.

As FIGS. 7A, 7B, 8A and 8B show, the spin valve film of this invention (FIGS. 7A and 7B) exhibits better magnetic characteristics than the conventional spin valve film (FIGS. 8A and 8B).

Further, TSSV-type spin valve films were made as Sample 2 of the present embodiment. Each spin valve film of Sample 2 comprised an under layer 2, i.e., 3-nm thick Ta film, a magnetization-free layer 6 composed of a 4-nm thick NiFe film and a 0.5-nm thick CoFe film, a nonmagnetic layer 5, i.e., a 2.2-nm Cu film, a magnetization-fixed layer 4 composed of a 2-nm thick CoFe film, a 0.9-nm Ru film and a 1.5-nm thick CoFe film, an anti-ferromagnetic layer 3, i.e., a 20-nm thick PtMn film, and a protective layer 7, i.e., a 3-nm thick Ta film. The layers 2, 6, 5, 4, 3 and 7 were formed on a Si—O substrate 1, laid one upon another in the order they are mentioned.

Heat treatment was carried out for four hours, while applying a magnetic field of 10 KOe in an atmosphere of 265° C. during the process of forming the anti-ferromagnetic layer 3. Oxygen was used as surfactant gas. Oxygen was introduced into the gas-exposure chamber 23, for 30 seconds at a flow rate that has been adjusted to a specific value.

Figure 9A:
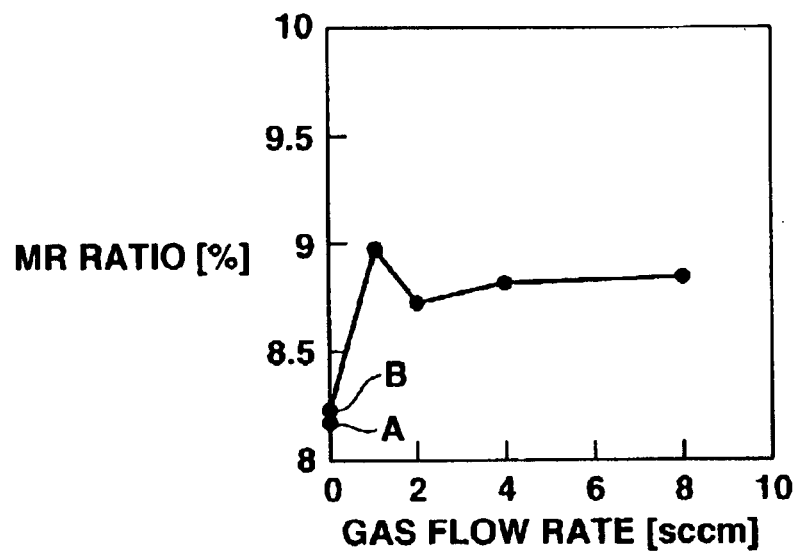
FIG. 9A is a graph showing the relation between the gas flow rate and the MR ratio of Sample 2 of a spin valve film.
Figure 9B:
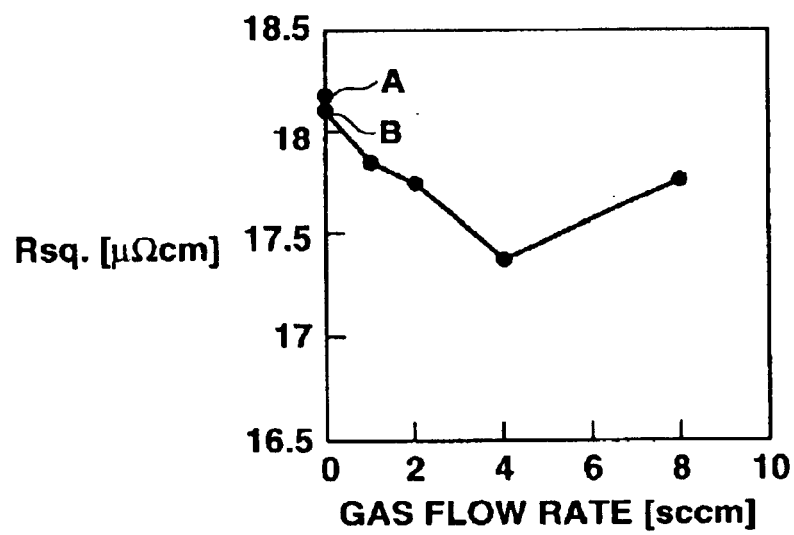
FIG. 9B is a graph illustrating the relation between the gas flow rate and the Rsq. of Sample 2.
Figure 9C:
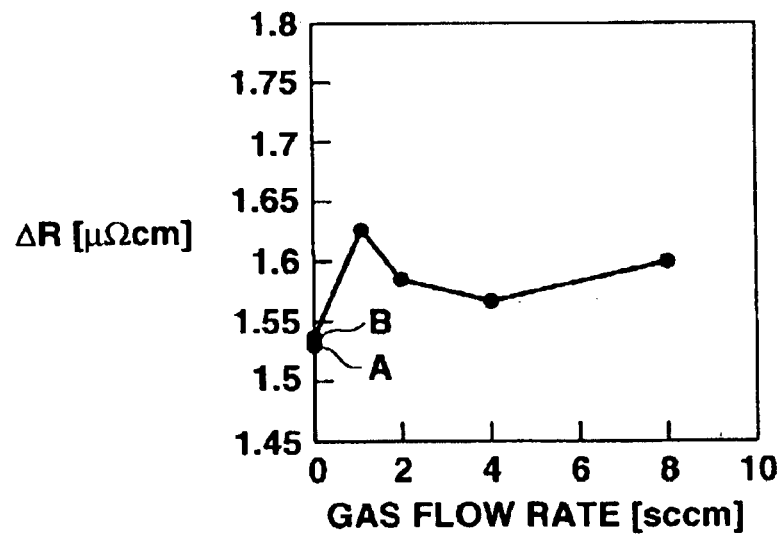
FIG. 9C is a graph representing the relation between the gas flow rate and ΔRsq. of Sample 2.
Figure 10:
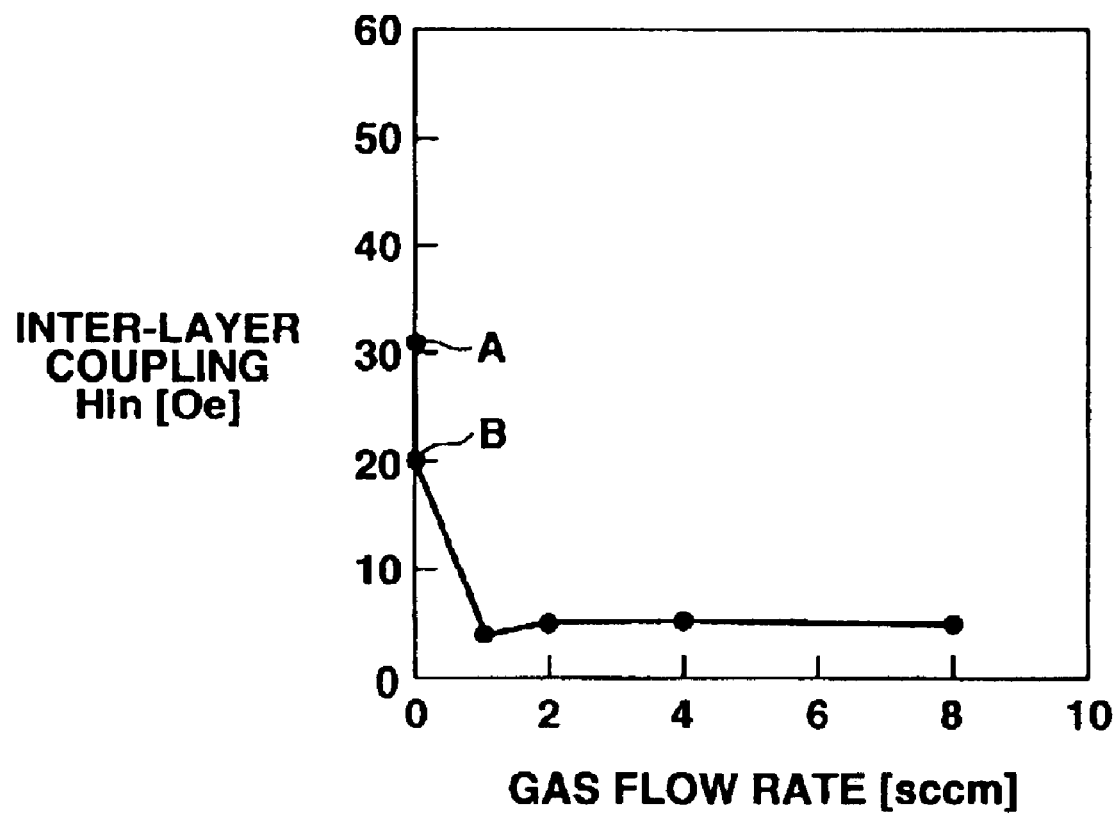
FIG. 10 is a graph representing the relation between the gas flow rate and the inter-layer coupling Hin of Sample 2 of a spin valve film.

The spin valve films of Sample 2 thus made were examined. The results were as is shown in FIGS. 9A, 9B and 9C and FIG. 10. FIG. 9A is a graph showing the relation between the gas flow rate and the MR ratio. FIG. 9B is a graph showing the relation between the gas flow rate and the Rsq. FIG. 9C is a graph representing the relation between the gas flow rate and ΔRsq. FIG. 10 is a graph depicting the relation between the gas flow rate and the inter-layer coupling Hin.

In FIGS. 9A, 9B and 9C and FIG. 10, two points A and B are shown. Point A pertains to a spin valve film formed without transporting the substrate 1 into the gas-exposure chamber 23, as in the conventional method. Point B pertains to a spin valve film formed without exposing the substrate 1 to an atmosphere of the surfactant gas, though the substrate 1 was bought into the gas-exposure chamber 23.

As the results shown in FIGS. 9A, 9B and 9C show, Rsq. greatly decreases as in Sample 1, regardless of the flow rate of the gas, if oxygen is introduced into the gas-exposure chamber 23. Rsq. increases after the amount of oxygen introduced falls to 4 sccm. This is probably because of the oxidation caused by the oxygen introduced in an excessive amount.

The MR ratio greatly increases, too. It reaches a maximum when oxygen is introduced in an amount of about 1 sccm. Likewise, ΔRsq. is maximal when oxygen is introduced in an amount of about 1 sccm.

As the measurement results of FIG. 10 reveal, the inter-layer coupling Hin gradually decreases as oxygen is introduced into the gas-exposure chamber 23 and increases in amount in the chamber 23. Thus, the inter-layer coupling Hin between the magnetization-fixed layer 4 and the magnetization-free layer 6 can be decreased to a desirable value if the substrate 1 is exposed in an atmosphere of the surfactant gas after the Cu film, i.e., nonmagnetic layer 5, has been formed.

Figure 11A:
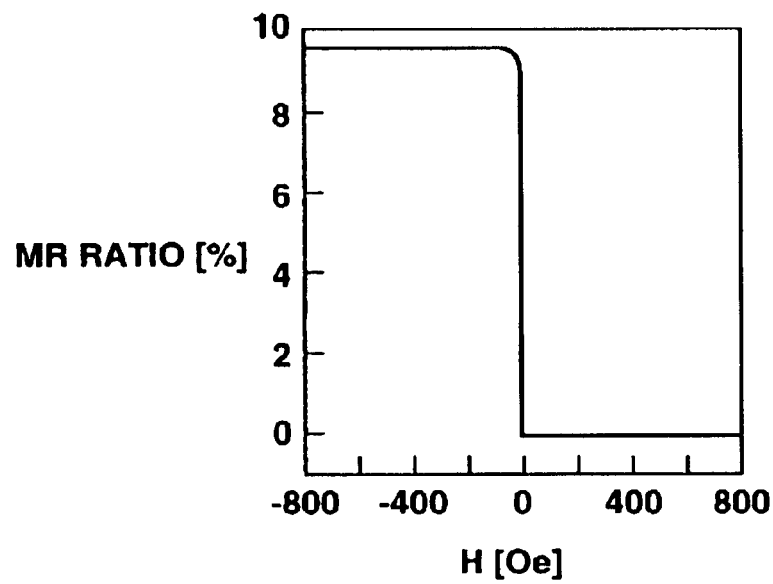
FIG. 11A is a graph showing the relation between external magnetic field H and the MR ratio of Sample 2 of a spin valve film.
Figure 11B:
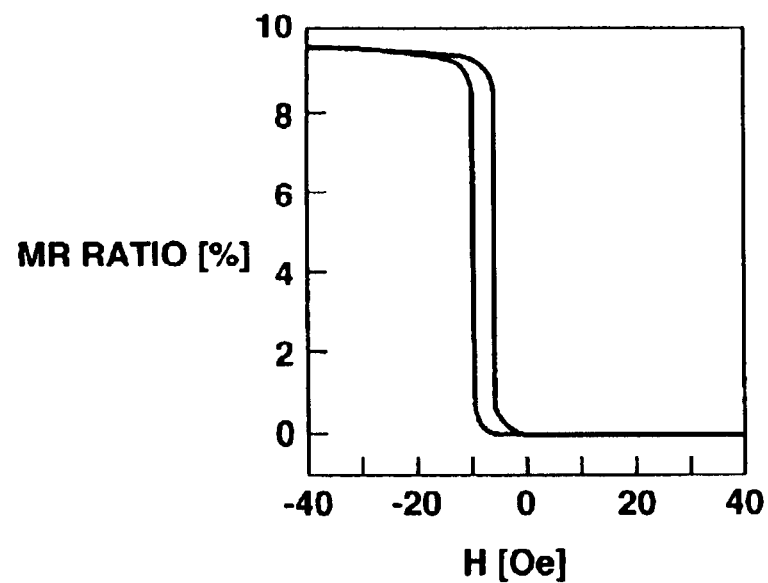
FIG. 11B is a magnified part of FIG. 11A, which shows a zero region of the external magnetic field.
Figure 12A:
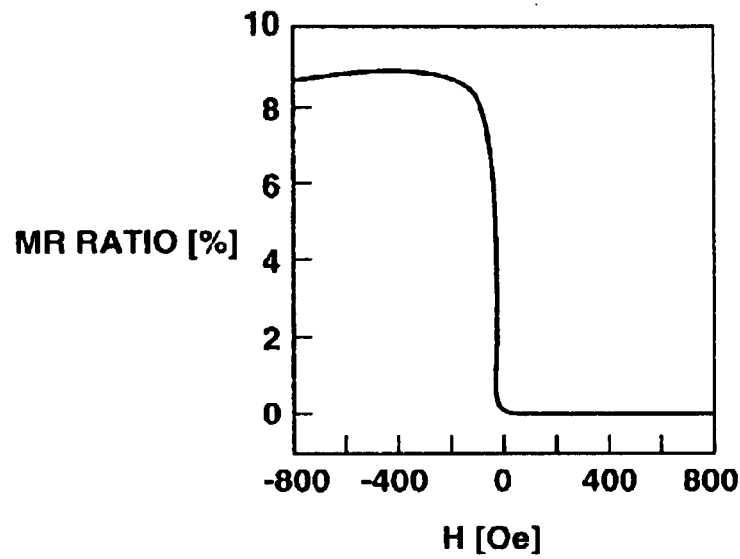
FIG. 12A is a graph depicting the relation between the external magnetic field H and the MR ratio of the conventional spin valve film, in comparison with Sample 2.
Figure 12B:
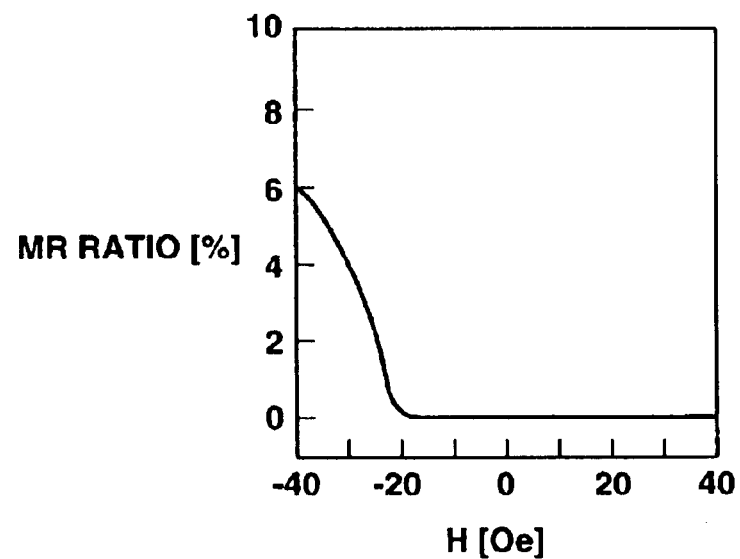
FIG. 12B is a magnified part of FIG. 12A, which shows a zero region of the external magnetic field.

FIGS. 11A and 11B are graphs representing the relation between the external magnetic field H and the MR ratio of Sample 2, i.e., a spin valve film made by introducing gas at a flow rate of 4 sccm, in accordance with the present invention. For the sake of comparison, FIGS. 12A and 12B show the relation between the external magnetic field H and the MR ratio of a spin valve film identical to Sample 2, except that it was formed without bringing the substrate 1 into the gas-exposure chamber 23 as in the conventional manufacturing method. FIG. 11B is a magnified part of FIG. 11A, which shows a zero region of the external magnetic field. Similarly, FIG. 12B is a magnified part of FIG. 12A, which shows a zero region of the external magnetic field.

As FIGS. 11A, 11B, 12A and 12B show, the spin valve film of this invention (FIGS. 11A and 11B) exhibits better magnetic characteristics than the conventional spin valve film (FIGS. 12A and 12B).

<Dependency on Gas-Reaction Time>

Spin valve films were produced by the method according to the present invention, by introducing the surfactant gas into the gas-exposure chamber 23 for different periods of time. The spin valve films thus made were tested for their magnetic characteristics, thereby to determine how the magnetic characteristics depend on the gas-reaction time.

In the present example, a BSSV-type spin valve film was made as Sample 3. Sample 3 comprised an under layer 2, i.e., 3-nm thick Ta film, an anti-ferromagnetic layer 3, i.e., a 20-nm thick PtMn film, a magnetization-fixed layer 4 composed of a 1.5-nm thick CoFe film, a 0.9-nm thick Ru film and a 2-nm thick CoFe film, a nonmagnetic layer 5, i.e., 2.2-nm thick Cu film, a magnetization-free layer 6 composed of a 0.5-in thick CoFe film and a 4-nm thick NiFe film, and a protective layer 7, i.e., 3-nm thick Ta film. The layers 2, 3, 4, 5, 6 and 7 were formed on a Si-O substrate 1, laid one upon another in the order they are mentioned.

Heat treatment was performed for four hours, while applying a magnetic field of 10 KOe in an atmosphere of 265° C. during the process of forming the anti-ferromagnetic layer 3. Oxygen was used as surfactant gas. Oxygen was introduced into the gas-exposure chamber 23, at a flow rate of 4 sccm, or the flow rate at which the gas was introduced to from Sample 1 to achieve the maximum MR ratio.

Spin valve films of Sample 3 were made by introducing oxygen, i.e., surfactant gas, for 15 seconds, 30 seconds, and 120 seconds. The relation between the external magnetic field H and MR ratio was measured of each of the spin valve films thus made. The results were as is shown in FIGS. 13A, 13B, 14A, 14B, 15A and 15B.

Figure 13A:
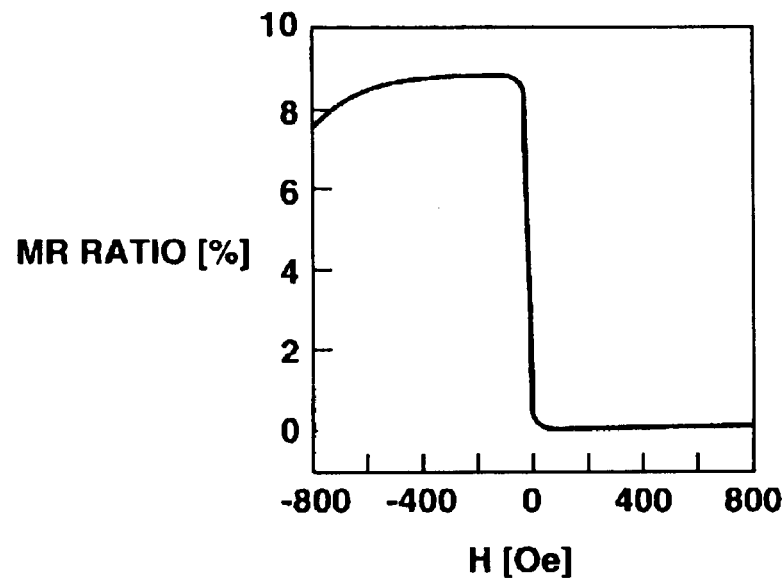
FIG. 13A is a graph showing the relation between that the external magnetic field H and the MR ratio of Sample 3 of a spin valve film have when oxygen is introduced for 15 seconds.
Figure 13B:
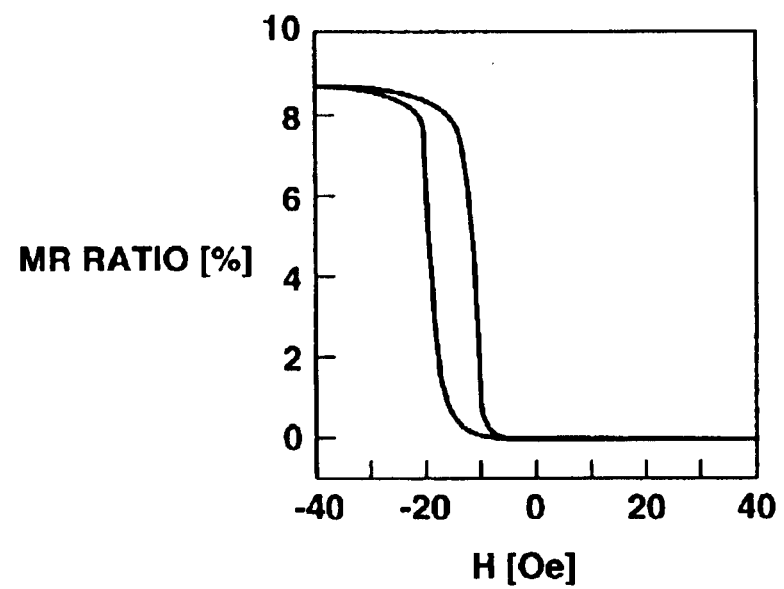
FIG. 13B is a magnified part of FIG. 13A, which shows a zero region of the external magnetic field.
Figure 14A:
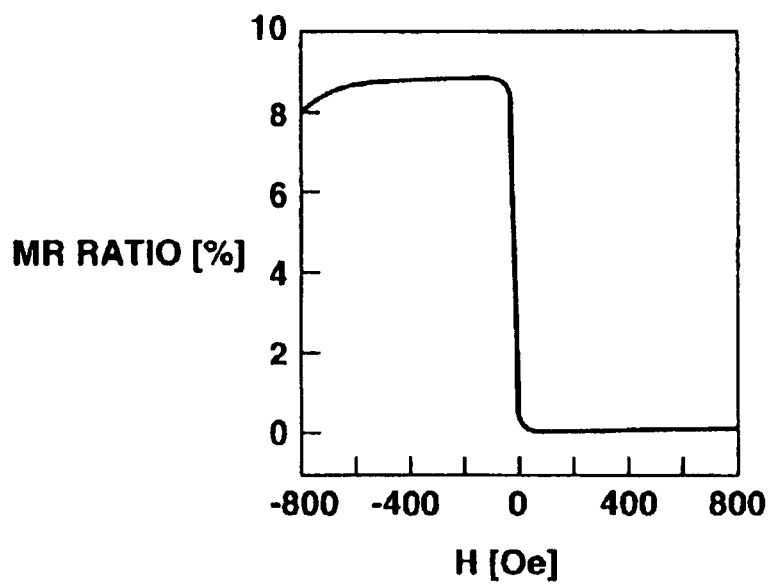
FIG. 14A is a graph representing the relation between that the external magnetic field H and the MR ratio of Sample 3 of a spin valve film have when oxygen is introduced for 30 seconds.
Figure 14B:
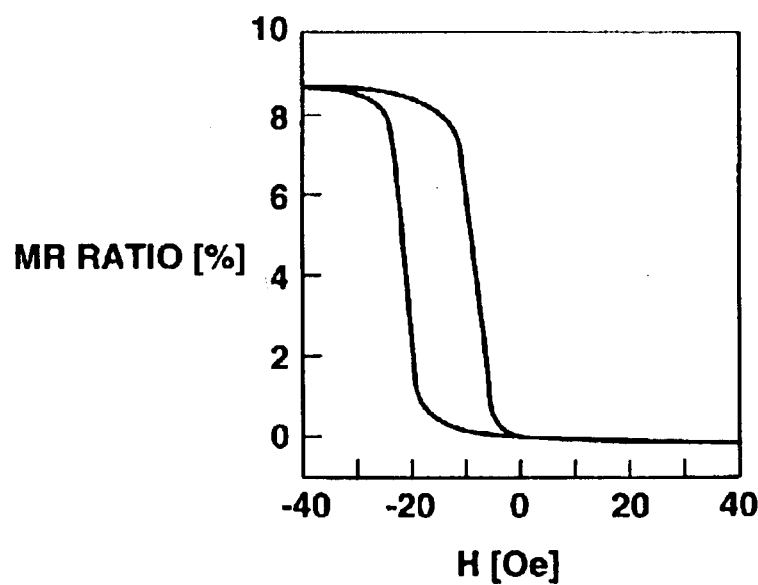
FIG. 14B is a magnified part of FIG. 14A, which shows a zero region of the external magnetic field.
Figure 15A:
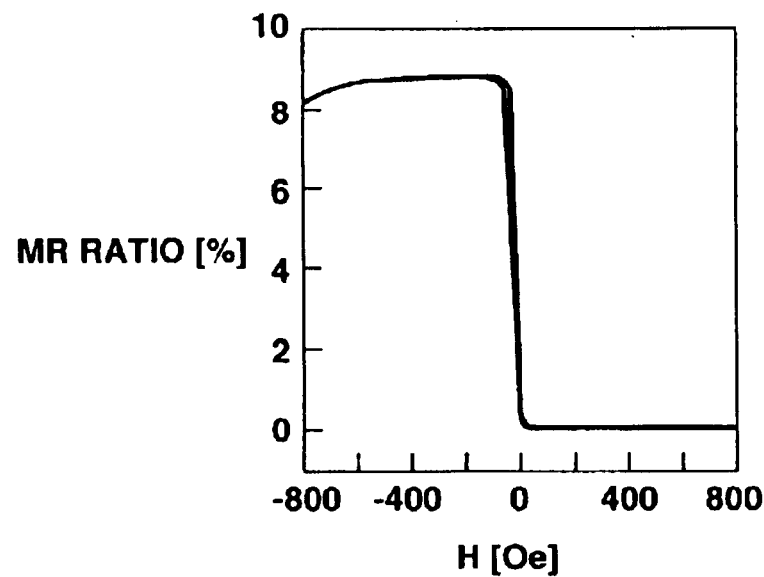
FIG. 15A is a graph illustrating the relation between that the external magnetic field H and the MR ratio of Sample 3 of a spin valve film have when oxygen is introduced for 120 seconds.
Figure 15B:
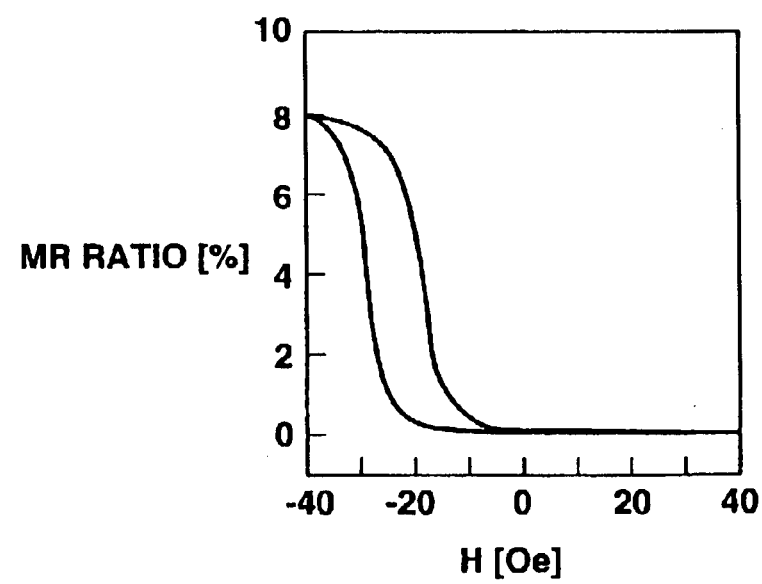
FIG. 15B is a magnified part of FIG. 15A, which shows a zero region of the external magnetic field.

FIGS. 13A and 13B are characteristic diagrams showing the relation between that the external magnetic field H and the MR ratio of a spin valve film that was formed by introducing oxygen for 15 seconds. FIG. 13B is a magnified part of FIG. 13A, which shows a zero region of the external magnetic field. FIGS. 14A and 14B are characteristic diagrams representing the relation between that the external magnetic field H and the MR ratio of a spin valve film that was formed by introducing oxygen for 30 seconds. FIG. 14B is a magnified part of FIG. 14A, which shows a zero region of the external magnetic field. FIGS. 15A and 15B are characteristic diagrams illustrating the relation between that the external magnetic field H and the MR ratio of a spin valve film that was formed by introducing oxygen 120 seconds. FIG. 15B is a magnified part of FIG. 15A, which shows a zero region of the external magnetic field.

As the measurement results of FIGS. 13A, 13B, 14A, 14B, 15A and 15B show, the spin valve films did not much differ in magnetic characteristics, though oxygen was introduced for different periods of time. Obviously, the gas-reaction time influenced, but a very little, the MR ratio (ΔRsq./Rsq.) and the inter-layer coupling Hin. It was found important to control the flow rate of gas or the pressure of gas.

<Dependency on Film Thickness>

Further, spin valve films were produced by the method according to the present invention, which differed in the thickness of the Cu film, i.e., nonmagnetic layer 5. The inter-layer coupling Hin acting between the magnetic-fixed layer 4 and the magnetic-free layer 6 of each spin valve film was measured to determine how it depended on the thickness of the Cu film. Like those of Sample 1, these spin valve films were examined for MR ratio (ΔRsq./Rsq.).

For comparison, spin valve films were formed without transporting the substrate 1 into the gas-exposure chamber 23, as in the conventional manufacturing method.

In the present example, a BSSV-type spin valve film was made as Sample 4. Sample 4 comprised an under layer 2, i.e., 3-nm thick Ta film, an anti-ferromagnetic layer 3, i.e., a 20-nm thick PtMn film, a magnetization-fixed layer 4 composed of a 1.5-nm thick CoFe film, a 0.9-nm thick Ru film and a 2-nm thick CoFe film, a nonmagnetic layer 5, i.e., Cu film having a thickness of 1.6 to 2.9 nm, a magnetization-free layer 6 composed of a 0.5-nm thick CoFe film and a 4-nm thick NiFe film, and a protective layer 7, i.e., 3-nm thick Ta film. The layers 2, 3, 4, 5, 6 and 7 were formed on a Si—O substrate 1, laid one upon another in the order they are mentioned.

Heat treatment was performed for four hours, while applying a magnetic field of 10 KOe in an atmosphere of 265° C. during the process of forming the anti-ferromagnetic layer 3. Oxygen was used as surfactant gas. Oxygen was introduced into the gas-exposure chamber 23 for 30 seconds, at a flow rate of 4 sccm, or the flow rate at which the gas was introduced to from Sample 1 to achieve the maximum MR ratio.

Figure 16:
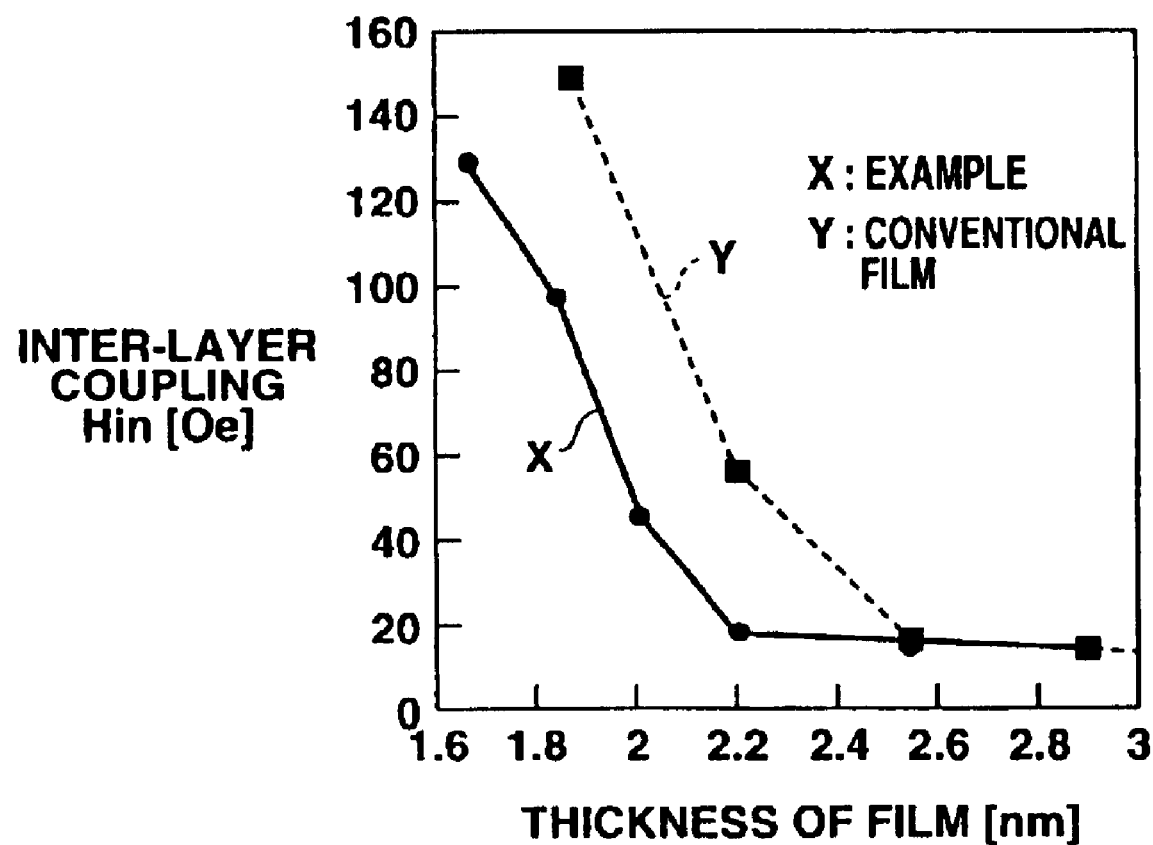
FIG. 16 is a graph showing the relation between the thickness of the Cu film and the inter-layer coupling Hin, observed in Sample 4 of a spin valve film.
Figure 17A:
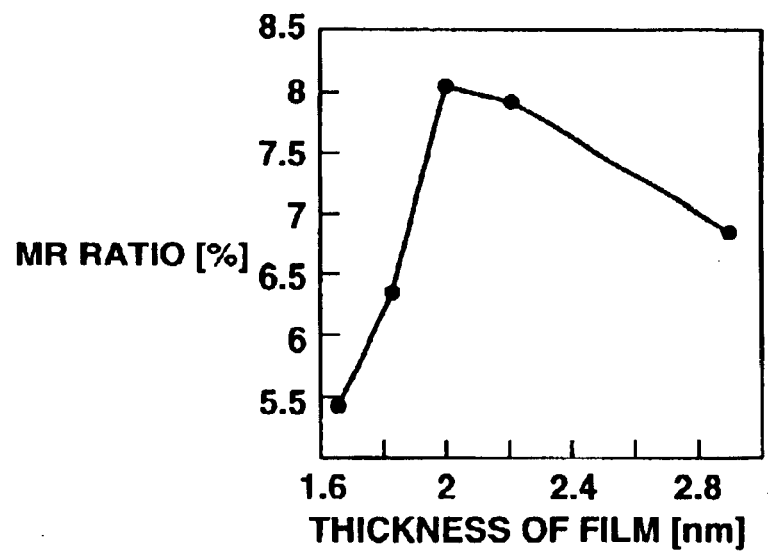
FIG. 17A is a graph illustrating the relation between the gas flow rate and the MR ratio of Sample 4 of a spin valve film.
Figure 17B:
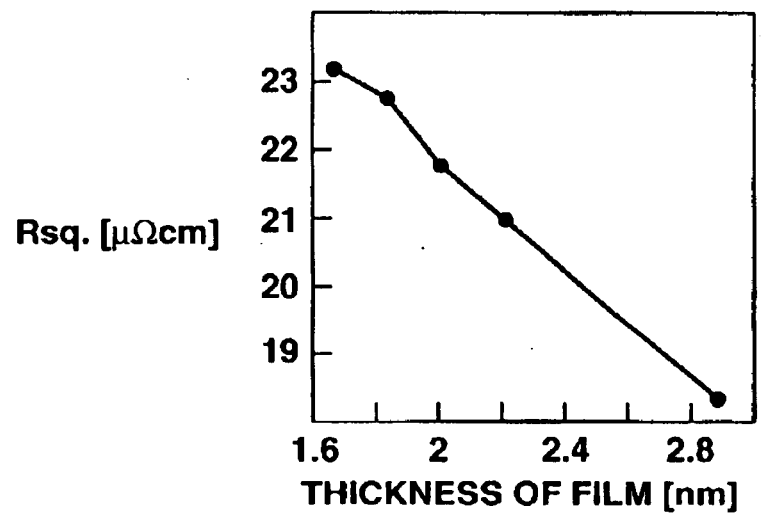
FIG. 17B is a graph illustrating the relation between the gas flow rate and the Rsq. of Sample 4.
Figure 17C:
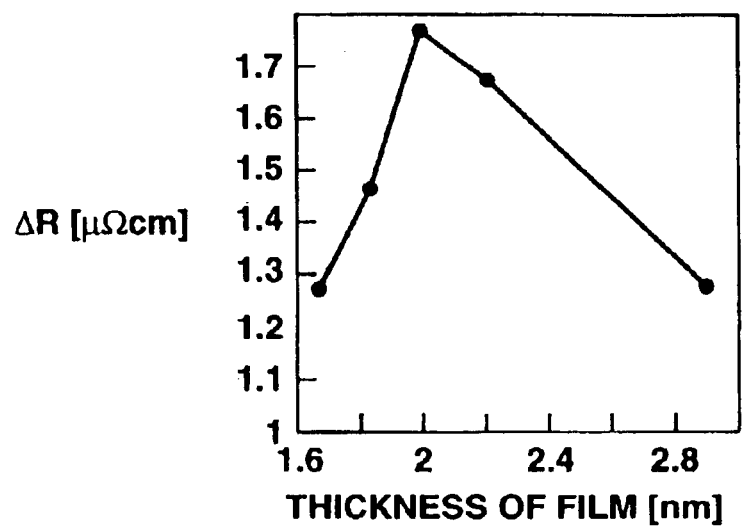
FIG. 17C is a graph representing the relation between the gas flow rate and ΔRsq. of Sample 4.

FIG. 16 and FIGS. 17A, 17B and 17C show the measurement results of Sample 4. FIG. 16 is a characteristic diagram representing the relation between the thickness of the Cu film (i.e., nonmagnetic layer 5) and the inter-layer coupling Hin. Graph X represents the relation observed in the films formed by a method according to the present invention. Graph Y represents the relation observed in the films formed without bringing the substrate 1 into the gas-exposure chamber 23 as in the conventional method. FIG. 17A is a characteristic diagram illustrating the relation between the thickness of the Cu film and the MR ratio. FIG. 17B is a characteristic diagram showing the relation between the thickness of the Cu film and the Rsq. FIG. 17C is a characteristic diagram depicting the relation between the thickness of the Cut film and ΔRsq.

As the measurement results of FIG. 16 and the comparison between Graphs X and Y show, no great difference is observed in inter-layer coupling Hin so long as the Cu film, or nonmagnetic layer 5. Nonetheless, the thinner the Cu film, i.e., nonmagnetic layer 5, the smaller the inter-layer coupling Hin of the spin valve film made by this invention. As seen from FIG. 16, the spin valve film of the invention has a smaller inter-layer coupling Hin than the spin valve film formed without transporting the substrate 1 into the gas-exposure chamber 23 as in the conventional method.

This is probably because the Cu film, i.e., nonmagnetic layer 5, had its surface state improved by oxygen used as surfactant gas. In this regard, it should be noted that the inter-layer coupling Hin consists of two components. The first is a quantum-dynamic one that changes with the thickness of the Cu film. The second is one that induces a ferromagnetic coupling due to orange-peel effect resulting from the interface roughness. It seems that the second component decreased as the surface state of the Cu film was improved when the substrate was exposed in the surfactant gas atmosphere.

If the substrate 1 is exposed in a surfactant gas atmosphere after the Cu film, or nonmagnetic layer 5, is formed, it is possible to suppress the inter-layer coupling Hin that acts between the magnetization-fixed layer 4 and the magnetization-free layer 6. Hence, the Cu film, or magnetic layer 5, can be made thin, from about 2.9 nm, which has been hitherto regarded as a standard value, to about 2.2 nm, provided that the inter-layer coupling Hin is equal to or less than 20 Oe that is considered to make no practical problems.

As the measurement results of FIGS. 17A, 17B and 17C show, Rsq. and ΔRsq. can be increased about 6% and about 23%, respectively. The MR ratio can therefore be enhanced by about 16%. This much helps to generate large outputs.

Spin valve films of Sample 4 were formed by the method of the invention, which had Cu films used as nonmagnetic layers 5 and having different thicknesses of 2.0 nm, 2.2 nm and 2.9 nm. The relation between the external magnetic field H and the MR ratio, observed in each spin valve film of Sample 4, are shown in FIGS. 18A, 18B, 19A, 19B, 20A and 20B.

Figure 18A:
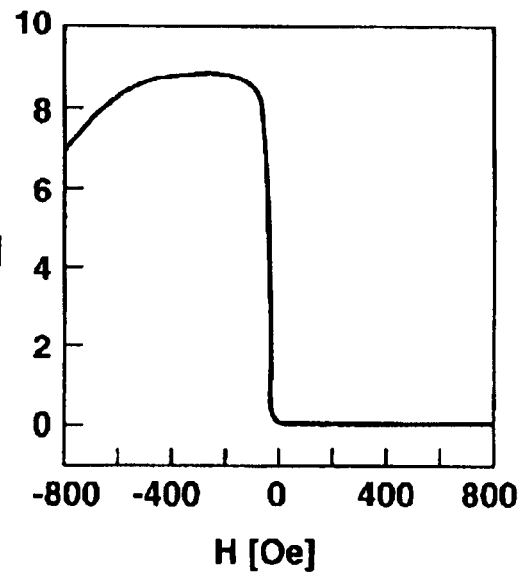
FIG. 18A is a graph showing the relation that the external magnetic field H and the MR ratio have in Sample 4 when the Cu film is 2.0 nm thick.
Figure 18B:
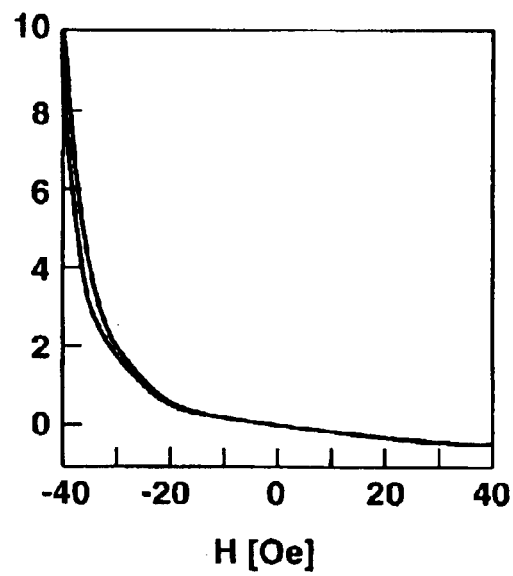
FIG. 18B is a magnified part of FIG. 18A, which shows a zero region of the external magnetic field.
Figure 19A:
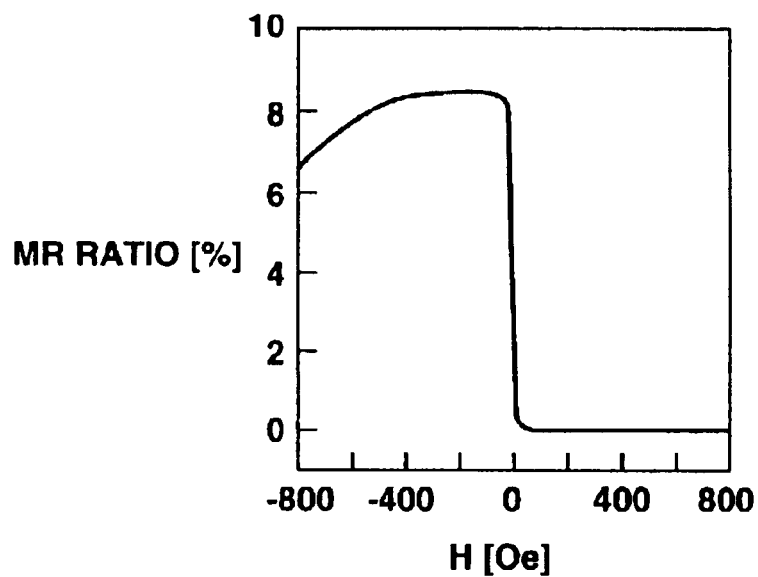
FIG. 19A is a graph showing the relation that the external magnetic field H and the MR ratio have in Sample 4 when the Cu film is 2.2 nm thick.
Figure 19B:
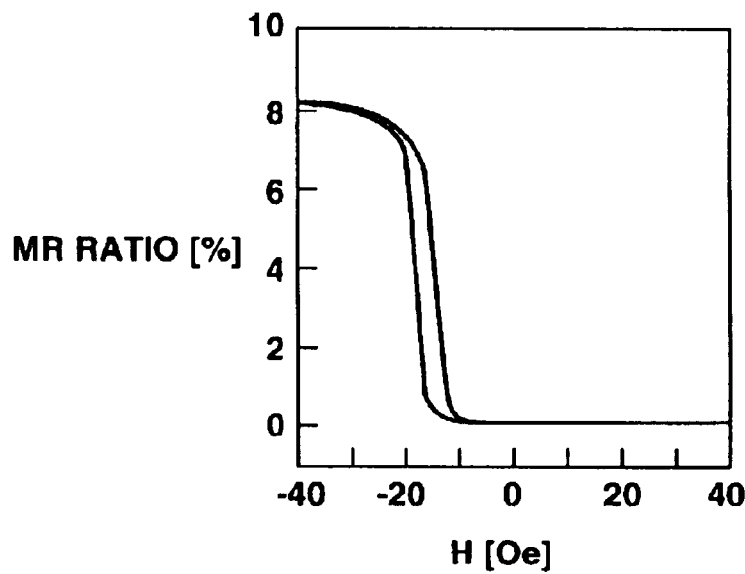
FIG. 19B is a magnified part of FIG. 19A, which shows a zero region of the external magnetic field.
Figure 20A:
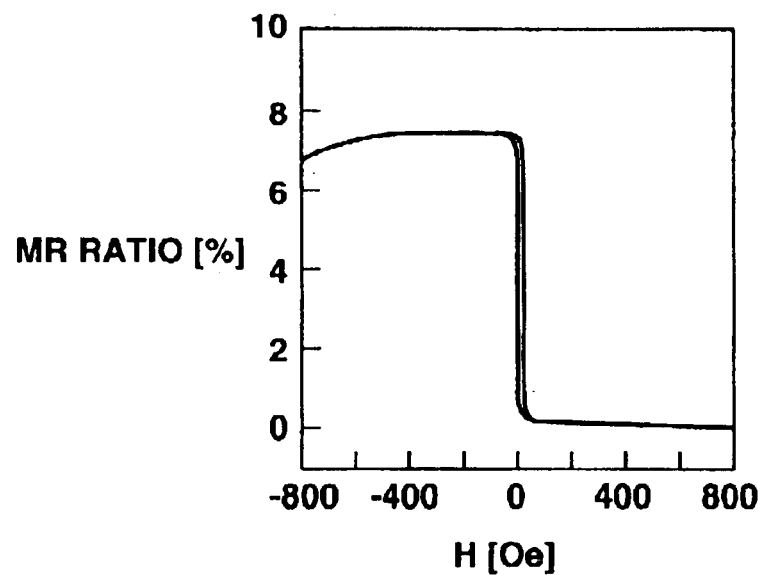
FIG. 20A is a graph showing the relation that the external magnetic field H and the MR ratio have in Sample 4 when the Cu film is 2.9 nm thick.
Figure 20B:
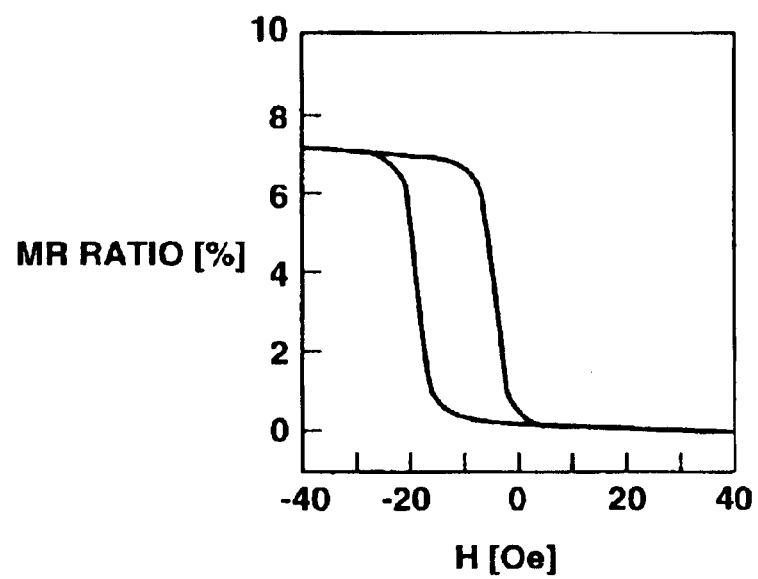
FIG. 20B is a magnified part of FIG. 20A, which shows a zero region of the external magnetic field.

FIGS. 18A and 18B are characteristic diagrams showing the relation that the external magnetic field H and the MR ratio have in spin valve films that have a 2.0-nm thick Cu film. FIG. 18B is a magnified part of FIG. 18A, which shows a zero region of the external magnetic field. FIGS. 19A and l9B are characteristic diagrams representing the relation that the external magnetic field H and the MR ratio have in spin valve films that have a 2.2-nm thick Cu film. FIG. 19B is a magnified part of FIG. 19A, which shows a zero region of the external magnetic field. FIGS. 20A and 20B are characteristic diagrams showing the relation that the external magnetic field H and the MR ratio have in spin valve films that have a 2.9-nm thick Cu film. FIG. 20B is a magnified part of FIG. 20A, which shows a zero region of the external magnetic field.

As seen from the measurement results of FIGS. 18A, 18B, 19A, l9B, 20A and 20B, the MR ratio shown in FIG. 17A increases, but the inter-layer coupling Hin shown in FIG. 16 increases, in any spin valve films that has a 2.0-nm thick Cu film (i.e., nonmagnetic layer 5). The spin valve film cannot acquire such good magnetic characteristic (MR curve) as the spin valve film having a 2.2-nm thick Cu film and the spin valve film having a 2.9-nm thick Cu film. If the Cu film that is used as nonmagnetic layer 5 is 1.83 nm or less thick, the MR ratio shown in FIG. 17A will decrease very much. This is probably because the inter-layer coupling Hin shown in FIG. 16 greatly increases since the Cu film is 1.83 nm or less. Due to the increase in the inter-layer coupling Hin, the external magnetic field H rotates the magnetization direction of the magnetization-free layer 6, which in turn rotates the magnetization direction of the magnetization-fixed layer 4.

<Dependency on Division of the Cu Film>

Spin valve films were produced, each formed by dividing the Cu film, or nonmagnetic layer 5, into parts and by exposing the substrate 1 in a surfactant gas atmosphere. The magnetic characteristics of these spin valve films were measured to determine how the division of the Cu film influences the characteristic of each spin valve film.

In the present example, BSSV-type spin valve films were formed as Sample 5. Each spin valve film of Sample 5 comprised an under layer 2, i.e., 3-nm thick Ta film, an anti-ferromagnetic layer 3, i.e., a 20-in thick PtMn film, a magnetization-fixed layer 4 composed of a 1.7-nm thick CoFe film, a 0.9-nm thick Ru film and a 2.2-nm thick CoFe film, a nonmagnetic layer 5, i.e., a 1.2-nm thick Cu film and a 1.2-nm thick Cu film, a magnetization-free layer 6 composed of a 1-nm thick CoFe film and a 2-nm thick NiFe film, and a protective layer 7, i.e., 3-nm thick Ta film. The layers 2, 3, 4, 5, 6 and 7 were formed on a Si—O substrate 1, laid one upon another in the order they are mentioned.

Heat treatment was carried out for four hours, while applying a magnetic field of 10 KOe in an atmosphere of 265° C. during the process of forming the anti-ferromagnetic layer 3 of each spin valve film. Oxygen was used as surfactant gas. Oxygen was introduced into the gas-exposure chamber 23 for 30 seconds, at a flow rate of 1 sccm.

Figure 21A:
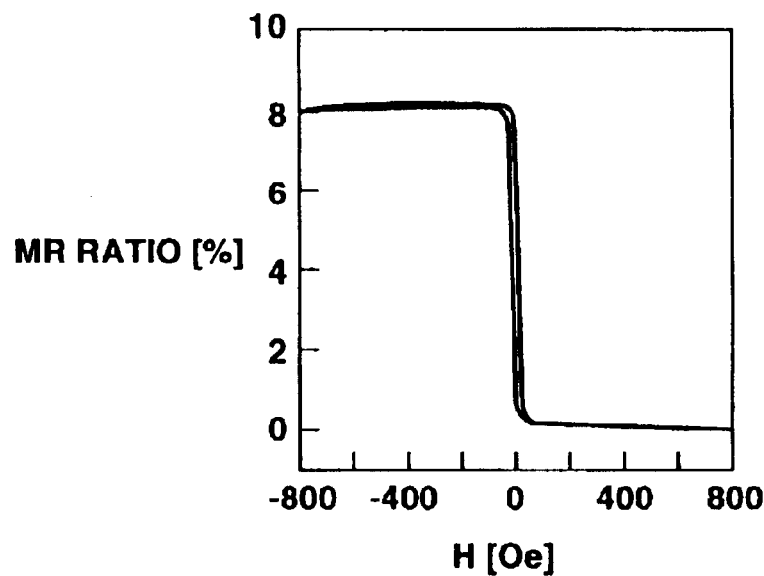
FIG. 21A is a graph illustrating the relation between the external magnetic field H and the MR ratio of Sample 5 of a spin valve film.
Figure 21B:
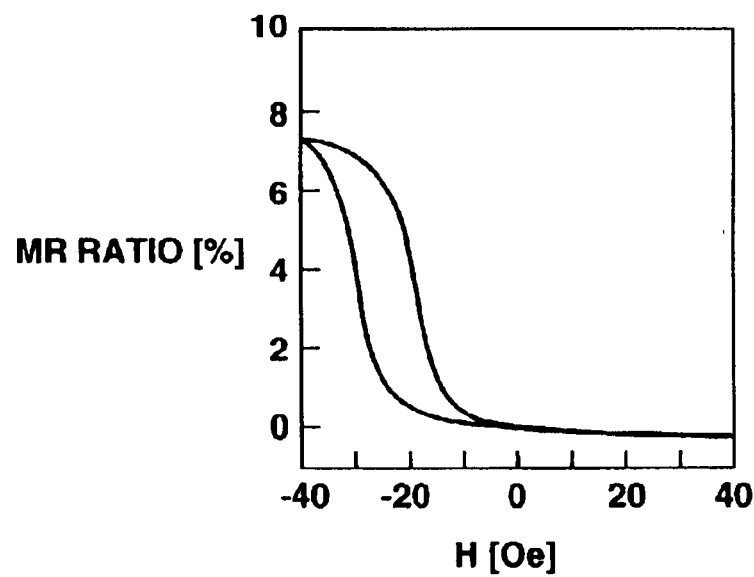
FIG. 21B is a magnified part of FIG. 21A, which shows a zero region of the external magnetic field.
Figure 22A:
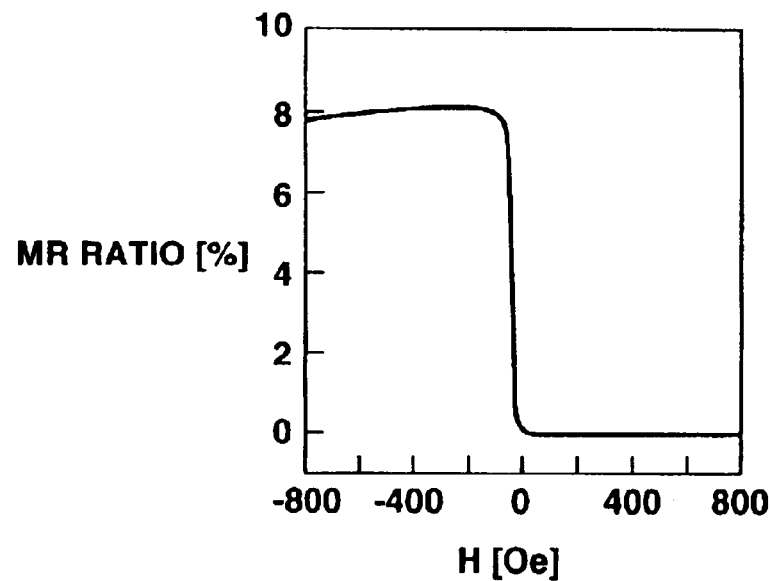
FIG. 22A is a graph depicting the relation between the external magnetic field H and the MR ratio of the conventional spin valve film, in comparison with Sample 2.
Figure 22B:
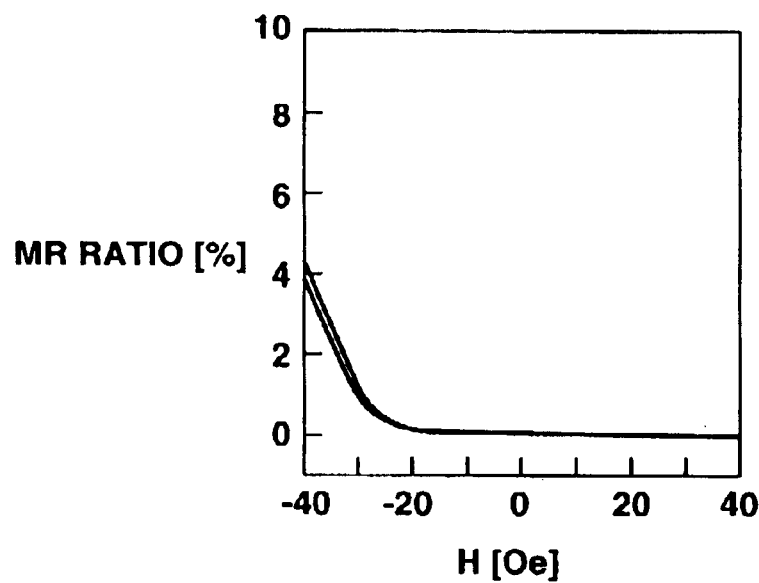
FIG. 22B is a magnified part of FIG. 22A, which shows a zero region of the external magnetic field.

The substrate 1 of each spin valve film was brought into the gas-exposure chamber 23 and exposed in the surfactant gas atmosphere after the first Cu film, i.e. the nonmagnetic layer 5, was formed. The spin valve films of Sample 5, thus formed, were examined to determine the relation between the external magnetic field H and the MR ratio. The results were as shown in FIGS. 21A and 21B. FIG. 21B is a magnified part of FIG. 21A, which shows a zero region of the external magnetic field;

For the sake of comparison, FIGS. 22A and 22B show the relation between the external magnetic field H and the MR ratio of spin valve films identical to Sample 5, except that they were formed without bringing the substrate 1 into the gas-exposure chamber 23 as in the conventional manufacturing method. FIG. 22B is a magnified part of FIG. 22A, which shows a zero region of the external magnetic field.

As the measurement results of FIGS. 21A, 21B, 22A and 22B reveal, the spin valve films, each formed by dividing the Cu film, or nonmagnetic layer 5, into parts (and by exposing the substrate 1 in the surfactant gas atmosphere, exhibited good magnetic characteristics. Further, it was possible to suppress the inter-layer coupling Hin acting between the magnetization-fixed layer 4 and the magnetization-free layer 6, as in the case where the substrate 1 having the Cu film, i.e., nonmagnetic layer 5, is exposed in an atmosphere of surfactant gas.

<Dependency on the Interface Exposed to Gas>

Spin valve films were produced, each formed by exposing the substrate 1 in the surfactant gas atmosphere, at a position other than the Cu film that serves as nonmagnetic layer 5. These spin valve films were examined for magnetic characteristics, thereby to determine how the interface at which the substrate 1 is exposed in the surfactant gas atmosphere influences the characteristic of each spin valve film.

TSV-type spin valve films were made as Sample 6 of the present embodiment. Each spin valve film of Sample 6 comprised an under layer 2, i.e., 3-nm thick Ta film, a magnetization-free layer 6 composed of a 4-nm thick NiFe film and a 2-nm thick CoFe film, a nonmagnetic layer 5, i.e., a 2.2-nm Cu film, a magnetization-fixed layer 4 composed of a 2-nm thick CoFe film, an anti-ferromagnetic layer 3, i.e., a 20-nm thick PtMn film, and a protective layer 7, i.e., a 3-nm thick Ta film. The layers 2, 6, 5, 4, 3 and 7 were formed on a Si—O substrate 1, laid one upon another in the order they are mentioned.

Heat treatment was effected for four hours, while applying a magnetic field of 2 KOe in an atmosphere of 265° C. during the process of forming the anti-ferromagnetic layer 3 of each spin valve film. Oxygen was used as surfactant gas. Oxygen was introduced into the gas-exposure chamber 23 for 30 seconds, at a flow rate of 30 sccm.

The substrates 1 of some spin valve films of Sample 6 was brought into the gas-exposure chamber 23 and exposed in the surfactant gas atmosphere after the Ta film, i.e., under layer 2, was formed. The spin valve films of Sample 6, thus formed, were examined to determine the relation between the external magnetic field H and the MR ratio. The results were as shown in FIG. 23A.

Further, the substrates 1 of some other spin valve films of Sample 6 was brought into the gas-exposure chamber 23 and exposed in the surfactant gas atmosphere after the NiFe film, i.e., magnetization-free layer 6, was formed. The spin valve films of Sample 6, formed in this manner, were examined to determine the relation between the external magnetic field H and the MR ratio. The results were as shown in FIG. 23B.

For comparison, the substrates 1 of some other spin valve films of Sample 6 was brought into the gas-exposure chamber 23 and exposed in the surfactant gas atmosphere after the Cu film, i.e., nonmagnetic layer 5, was formed. The spin valve films of Sample 6, formed in this way, were examined to determine the relation between the external magnetic field H and the MR ratio. The results were as shown in FIG. 23C.

Moreover, spin valve films were formed, which were identical to Sample 6, except that they were formed without bringing the substrate 1 into the gas-exposure chamber 23 as in the conventional manufacturing method. These spin valve films were examined to determine the relation between the external magnetic field H and the MR ratio. The results were as shown in FIG. 23D.

As the measurement results of FIGS. 23A, 23B, 23C and 23D show, the spin valve films formed by exposing the substrate 1 in the surfactant gas atmosphere after the Ta film or NiFe film was formed exhibited a lower MR ratios than any spin valve film formed by exposing the substrate 1 in the surfactant gas atmosphere after the Cu film (i.e., nonmagnetic layer 5) was formed and than any spin valve films formed without bringing the substrate 1 into the gas-exposure chamber 23 as in the conventional manufacturing method. Thus, it is preferable to expose the substrate 1 in the surfactant gas atmosphere after the Cu film, i.e., nonmagnetic layer 5, has been formed.

The spin valve films formed by exposing the substrate 1 in the surfactant gas atmosphere after the Ta film or the NiFe film was formed have low MR ratios. This is probably because the crystal orientation was impaired or impurities were mixed into the substrate 1.

To evaluate the changes in crystal orientation, X-ray diffraction analysis was performed to determine the relation between the X-ray relative strength of the PtMn film, or anti-ferromagnetic layer 3, and the X-ray relative strength of the NiFe film, or magnetization-free layer 6. The results were as shown in FIG. 24.

Figure 24:
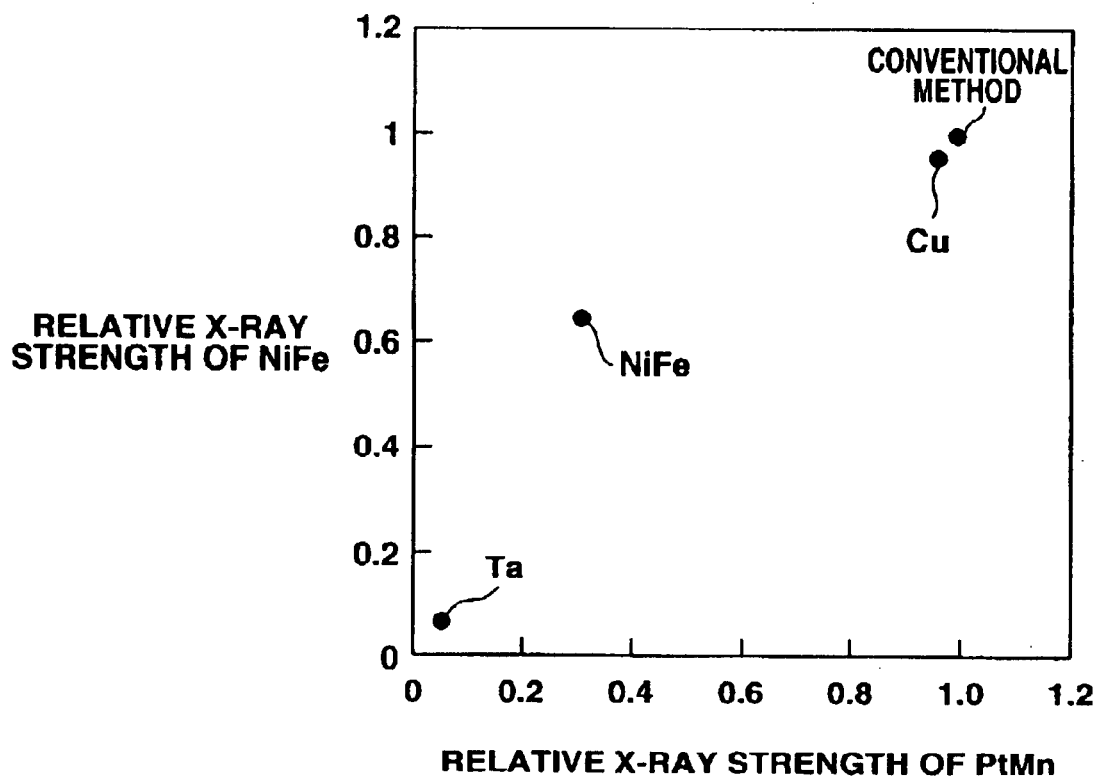
FIG. 24 is a graph representing the relation between the relative X-ray strength of the PtMn film and the relative X-ray strength of the NiFe film, which are incorporated in Sample 6.

As the measurement results of FIG. 24 show, the PtMn film and the NiFe film did not have their X-ray relative strengths reduced in the case where the substrate 1 was exposed in a surfactant gas atmosphere after the Cu film was formed as in the present invention. In the case where the substrate 1 was not exposed in a surfactant gas atmosphere, as in the conventional method, the PtMn film and the NiFe film did not have their X-ray relative strengths reduced.

By contrast, the PtMn film and the NiFe film had their X-ray relative strengths greatly reduced in the case where the substrate 1 was exposed in a surfactant gas atmosphere after the Ta film and the NiFe film were formed. The crystal orientation of the NiFe film is considered to influence the soft-magnetic characteristic of the magnetization-free layer 6. The crystal orientation of the PtMn film is considered to influence the characteristic of the anti-ferromagnetic layer 3. In view of this, too, it is obviously desirable to expose the substrate 1 in the surfactant gas atmosphere after the Cu film, or nonmagnetic layer 5, has been formed.

A method of manufacturing a magnetoresistance-effect magnetic head according to the present invention will be described.

Figure 25:
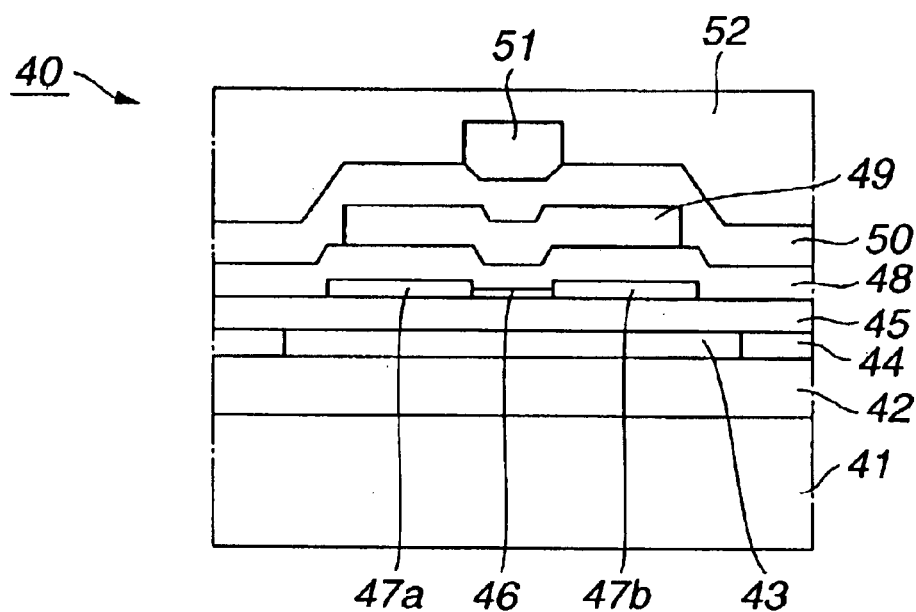
FIG. 25 is an end view of a magnetoresistance-effect magnetic head manufactured by using the present invention.

The method is devised to manufacture a magnetoresistance-effect magnetic head 40 (hereinafter referred to as "MR head") of the type illustrated in FIG. 25. The MR head 40 according to this invention will be described first. FIG. 25 is a schematic end view of the MR head 40, seen from the side that opposes a magnetic recording medium. In the following description, particular material, specific size and thickness, and a specific film-forming process will be exemplified for each of the components. Nonetheless, the material and dimensions of the component are not limited to these specified.

The MR head 40 comprises a substrate 41, a first nonmagnetic layer 42, a first soft-magnetic film 43, a second nonmagnetic layer 44, a third nonmagnetic film 45, a spin valve film 46, a pair of electrode films 47a and 47b, a fourth nonmagnetic film 48, and a second soft-magnetic film 49. The first nonmagnetic layer 42, or under layer, is provided on the substrate 41. The first soft-magnetic film 43, or under shield, is formed on the first non-magnetic layer 42. The second nonmagnetic layer 44, or under shield, is provided on the first non-magnetic layer 42 and has an upper surface set in flush with that of the first soft-magnetic film 43. The third nonmagnetic film 45, or under-layer gap, is formed on the first soft-magnetic film 43 and the second nonmagnetic film 44. The spin valve film 46 is provided on the third nonmagnetic film 45. The spin valve film 46 and the electrode films 47a and 47b constitute a magnetoresistance-effect element (hereinafter called "MR element"). The fourth nonmagnetic film 48 is formed on the third nonmagnetic film 45, covering the electrode films 47a and 47b, both formed on the nonmagnetic film 45, and functions as an upper-layer gap. The second soft-magnetic film 49 is provided on the fourth nonmagnetic film 48, lies right above the spin valve film 46, and functions as an upper shield.

In the MR head 40, the third nonmagnetic film 45 and the fourth nonmagnetic film 48, which serve as the lower-layer gap and the upper-layer gap, respectively, are provided between the first soft-magnetic film 43 and the second soft-magnetic film 49 which serve as the lower shield and the upper shield, respectively. Therefore, the third nonmagnetic film 45 and the fourth nonmagnetic film 48 define a reproduction gap, with the spin valve film 46, i.e., the MR element, interposed between them.

On the MR head 40 an inductive head is provided as a recording head. The inductive head comprises a fifth nonmagnetic film 50, a thin-film coil (not shown), and a third soft-magnetic film 51. The fifth nonmagnetic film 50 is provided on the second soft-magnetic film 49 that serves as a lower-layer core. The film 50 has a prescribed thickness at the side opposes the recording medium. The thin-film coil is embedded in the fifth nonmagnetic film 50. The third soft-magnetic film 51 abuts on the second soft-magnetic film 49, at the center part of the thin-film coil, and serves as an upper-layer core. A sixth nonmagnetic film 52, which serves as a protective layer, is formed on the third soft-magnetic film 51.

In the inductive head, the second soft-magnetic film 49 and the third soft-magnetic film 51, which serve as lower-layer core and upper-layer core, respectively, constitute a magnetic core. The fifth nonmagnetic film 50 is interposed between the second soft-magnetic film 49 and the third soft-magnetic film 51, thus defining a magnetic gap.

In the MR head 40, a constant sense current is supplied via the pair of electrode films 47a and 47b to the spin valve film 46 that works as MR element to reproduce magnetic signals from the magnetic recording medium. The resistance of the spin valve film 46 changes in accordance with the signal magnetic field emanating from the magnetic recording medium. The voltage of the sense current supplied to the spin valve film 46 therefore changes with the change of the resistance of the spin valve film 46. Hence, the MR head 40 can detect the signal magnetic field emanating from the magnetic recording medium by measuring the change in the voltage of the sense current.

To record a magnetic signal on the magnetic recording medium, a current corresponding to the signal is supplied to the thin-film coil of the inductive head. A magnetic flux extending from the magnetic field emanating from the thin-film coil passes through the magnetic core composed of the second soft-magnetic film 49 and the third soft-magnetic film 51. As a result, the inductive head generates a leakage magnetic field in the gap between the second soft-magnetic film 49 and the third soft-magnetic film 51. The leakage magnetic field is applied to the medium, thereby recording the magnetic signal on the magnetic recording medium.

How the MR head 40 is manufactured will be described. First, a substrate 41 shaped like a flat plate and made of hard nonmagnetic material such as $Al_2O_3$—TiC (Altic) or the like is prepared. The substrate 41 is mirror-polished at one major surface.

Next, a first nonmagnetic film 42, or an under layer, is formed on the major surface of the substrate 41. The first nonmagnetic film 42 is an $Al_2O_3$ film having a thickness of about 5 μm. The film 42 is polished to have a smooth surface.

A first soft-magnetic film 43, or a lower magnetic shield, is formed on the first nonmagnetic film 42. The first soft-magnetic film 43 may be made of material exhibiting good soft-magnetic characteristic, such as Fe—Al—Si alloy (Sendust), Fe—Si—Ru—Ga alloy or Fe—Ta—N alloy. In this embodiment, the first soft-magnetic film 43 is made of Sendust and is formed to a thickness of about 3 to 5 μm, by means of dry etching using a resist pattern.

A second nonmagnetic film 44 is formed on the first soft-magnetic film 43, which in turn has been formed on the first nonmagnetic film 42. The second nonmagnetic film 44 may be made of nonmagnetic material such as diamond-like carbon (DLC) or $Al_2O_3$. More precisely, the film 44 is made of diamond-like carbon (DLC) and is formed to a thickness of about 3 to 5 μm, by means of high-frequency sputtering. The second nonmagnetic film 44 may be formed while applying an external magnetic field to the structure, in order to control the magnetic characteristic of the first soft-magnetic film 43.

The second nonmagnetic film 44 is polished, exposing the first soft-magnetic film 43 embedded in the second nonmagnetic film 44. Thus polished, the second nonmagnetic film 44 has its surface rendered flush with the surface of the first soft-magnetic film 43.

It is desirable to polish the second nonmagnetic film 44 until the film 44 and the first soft-magnetic film 43 have a surface roughness decreased to 1 μm or less. If the films 43 and 44 are so polished, a third nonmagnetic film 45 will be formed with high thickness precision.

Next, the third nonmagnetic film 45 is formed on the first soft-magnetic film 43 and second nonmagnetic film 44 whose surfaces are flush with each other. The third nonmagnetic film 45 is made of diamond-like carbon (DLC) and formed to a thickness of 0.3 to 0.5 μm by high-frequency plasma process. The third nonmagnetic film 45 may be formed, while applying an external magnetic field to the structure, in order to control the magnetic characteristic of the first soft-magnetic film 43. It is desirable to polish the third nonmagnetic film 45 until the film 45 has its surface roughness decreased to 1 nm or less. If the films 45 is so polished, a spin valve film 46 and a pair of electrode films 47a and 47b will be formed with high thickness precision so that the MR head 40 may reproduce signals at high efficiency.

The spin valve film 46, or a magnetoresistance-effect element, is formed on the third nonmagnetic film 45 by the method according to this invention, which has been described above.

That is, the spin valve film 46 is formed by using the sputtering apparatus 20 described above. More specifically, an under layer 2, i.e., 3-nm thick Ta film, an anti-ferromagnetic layer 3, i.e., a 20-nm thick PtMn film, a magnetization-fixed layer 4 composed of a 1.5-nm thick CoFe film, a 0.8-nm thick Ru film and a 2.0-nm thick CoFe film, a nonmagnetic layer 5, i.e., a 2.2-nm thick Cu film, a magnetization-free layer 6 composed of a 0.5-nm thick CoFe film and a 4-nm thick NiFe film, and a protective layer 7, i.e., 3-nm thick Ta film are formed one upon another in the order they are mentioned.

After the Cu film, or nonmagnetic layer 5, has been formed in the film-forming sputtering chamber 22 of the sputtering apparatus 20, the substrate 41 is transported into the gas-exposure chamber 23. In the gas-exposure chamber 23, the substrate 41 is exposed to a surfactant gas atmosphere. The Cu film is thereby activated at its surface. The surface of the Cu film, or nonmagnetic layer 5, becomes smooth. The anti-ferromagnetic layer 3 can be formed at a high vacuum in the film-forming sputtering chamber 22.

With this method it is possible to suppress the inter-layer coupling between the magnetization-fixed layer 4 and the magnetization-free layer 6 even if the Cu film, i.e., the nonmagnetic layer 5 interposed between the layers 4 and 6 is made thin. Further, the anti-ferromagnetic layer can acquire good characteristics. It is therefore possible to provide a high-quality spin valve film that is improved in terms of MR ratio.

Next, a pair of electrode films 47a and 47b are formed on the end parts of the spin valve film 46. The electrode films 47a and 47b are made of conductive material such as Cu. They are formed on the end parts of the spin valve film 46, respectively, by vapor deposition, sputtering, or the like.

Then, a fourth nonmagnetic film 48, or upper-layer gap, is formed on the third nonmagnetic film 45, on which the spin valve film 46 and the electrode films 47a and 47b are formed. The fourth nonmagnetic film 48 is made of non-magnetic insulating material such as $Al_2O_3$ and is formed by sputtering or the like.

A second soft-magnetic film 49, which functions as both an upper-layer shield and a lower-layer core, is formed on the fourth nonmagnetic film 48. Like the first soft-magnetic film 43, the second soft-magnetic film 49 is made of soft-magnetic material.

A fifth nonmagnetic film 50 is formed on the second soft-magnetic film 49. The fifth nonmagnetic film 50 is made of nonmagnetic insulating material such as $Al_2O_3$ and is formed by means of, for example, sputtering. A thin-film coil (not shown) is formed in the fifth non-magnetic film 50. The thin-film coil is a spiral one at the center of which is located at the junction between the second soft-magnetic film 49 and a third soft-magnetic film 51 (later described).

The third soft-magnetic film 51, which serves as upper-layer core, is formed on the fifth nonmagnetic film 50. The third soft-magnetic film 51 is made of good soft-magnetic material, like the first soft-magnetic film 43 and the second soft-magnetic film 49. The third soft-magnetic film 51 contacts the second soft-magnetic film 49 at the center of the thin-film coil.

Next, a sixth nonmagnetic film 52, which serves as a protective film, is formed on the entire surface of the substrate 41. The sixth nonmagnetic film 52 is made of nonmagnetic insulating material such as $Al_2O_3$ and is formed by sputtering or the like.

With the method of this invention it is easy to manufacture a magnetoresistance-effect magnetic head that has an improved MR ratio.

Industrial Applicability

As has been described, the present invention can suppress the inter-layer coupling acting between a magnetization-fixed layer and a magnetization-free layer even if the Cu film interposed between said layers and serving as a nonmagnetic layer is made thin. In addition, the invention can form an anti-ferromagnetic layer in a higher vacuum. The present invention therefore makes it easy to manufacture a high-quality spin valve film that exhibits an improved rate of change in magnetoresistance. The invention can also makes it easy to manufacture a high-quality magnetoresistance-effect magnetic head that comprises such a spin valve film used as a magnetism-sensitive element for detecting magnetic signals emanating from magnetic recording media.

What is claimed is:

1. A method of manufacturing a spin valve film on a substrate comprising the steps of:

forming an anti-ferromagnetic layer in a film-forming sputtering chamber;

forming, in the film-forming sputtering chamber, a magnetization-fixed layer magnetized in a prescribed direction by an exchange coupling magnetic field acting between it and the anti-ferromagnetic layer;

forming, in the film-forming sputtering chamber, a magnetization-free layer having a magnetization direction in accordance with an external magnetic field; and forming a nonmagnetic layer by depositing a nonmagnetic layer made of a Cu film which in use magnetically isolates the magnetization-fixed layer and the magnetization-free layer, said nonmagnetic film being deposited by means of sputtering performed at a reduced pressure in said film-forming sputtering chamber, and then exposing the nonmagnetic layer in a gas atmosphere in a gas-exposure chamber filled with gas that activates a surface of the Cu film; and providing said layers on the substrate.

2. The method of manufacturing a spin valve film, according to claim 1, wherein at least the anti-ferromagnetic layer, the magnetization-fixed layer, the nonmagnetic layer and the magnetization-free layer are formed on the substrate, one upon another in the order mentioned.

3. The method of manufacturing a spin valve film, according to claim 1, wherein at least the magnetization-free layer, the nonmagnetic layer, the magnetization-fixed layer and the anti-ferromagnetic layer are formed on the substrate, one upon another in the order mentioned.

4. The method of manufacturing a spin valve film, according to claim 1, wherein at least the anti-ferromagnetic layer, the magnetization-fixed layer, the nonmagnetic layer, the magnetization-free layer, another nonmagnetic layer, another magnetization-fixed layer and another anti-ferromagnetic layer are formed on the substrate, one upon another in the order mentioned.

5. The method of manufacturing a spin valve film, according to claim 1, wherein an inert gas is introduced into the gas-exposure chamber before the gas that activates the surface of the Cu film is introduced into the gas-exposure chamber.

6. The method of manufacturing a spin valve film, according to claim 1, wherein the gas that activates the surface of the Cu film contains at least one gas selecting from the group consisting of oxygen, hydrogen and nitrogen.

7. The method of manufacturing a spin valve film, according to claim 1, wherein the anti-ferromagnetic layer is made of anti-ferromagnetic material that contains Mn.

8. A method of manufacturing a magnetoresistance-effect magnetic head on a substrate comprising a spin valve film as a magnetism-sensitive element for detecting magnetic signals emanating from magnetic recording media, the method comprising the steps of:

forming an anti-ferromagnetic layer in a film-forming sputtering chamber;

forming, in the film-forming sputtering chamber, a magnetization-fixed layer magnetized in a prescribed direction by an exchange coupling magnetic field acting between it and the anti-ferromagnetic layer;

forming, in the film-forming sputtering chamber, a magnetization-free layer having a magnetization direction in accordance with an external magnetic field; and forming a nonmagnetic layer by depositing a nonmagnetic layer made of a Cu film which in use magnetically isolates the magnetization-fixed layer and the magnetization-free layer, said nonmagnetic film being deposited by means of sputtering performed at a reduced pressure in said film-forming sputtering chamber, and then exposing the nonmagnetic layer in a gas atmosphere in a gas-exposure chamber filled with gas that activates a surface of the Cu film; and providing said layers on the substrate.

9. The method of manufacturing a magnetoresistance-effect magnetic head, according to claim 8, wherein at least the anti-ferromagnetic layer, the magnetization-fixed layer, the nonmagnetic layer and the magnetization-free layer are formed on the substrate, one upon another in the order mentioned.

10. The method of manufacturing a magnetoresistance-effect magnetic head, according to claim 8, wherein at least the magnetization-free layer, the nonmagnetic layer, the magnetization-fixed layer and the anti-ferromagnetic layer are formed on the substrate, one upon another in the order mentioned.

11. The method of manufacturing a magnetoresistance-effect magnetic head, according to claim 8, wherein at least the anti-ferromagnetic layer, the magnetization-fixed layer, the nonmagnetic layer, the magnetization-free layer, another nonmagnetic-layer, another magnetization-fixed layer and another anti-ferromagnetic layer are formed on the substrate, one upon another in the order mentioned.

12. The method of manufacturing a magnetoresistance-effect magnetic head, according to claim 8, wherein an inert gas is introduced into the gas-exposure chamber before the gas that activates the surface of the Cu film is introduced into the gas-exposure chamber.

13. The method of manufacturing a magnetoresistance-effect magnetic head, according to claim 8, wherein the gas that activates the surface of the Cu film contains at least one gas selecting from the group consisting of oxygen, hydrogen and nitrogen.

14. The method of manufacturing a magnetoresistance-effect magnetic head, according to claim 8, wherein the anti-ferromagnetic layer is made of anti-ferromagnetic material that contains Mn.

* * * * *